United States Patent
Chiu

(10) Patent No.: US 7,102,398 B1
(45) Date of Patent: Sep. 5, 2006

(54) CIRCUIT FOR TWO PLLS FOR HORIZONTAL DEFLECTION

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 124 days.

(21) Appl. No.: 10/880,954

(22) Filed: Jun. 30, 2004

(51) Int. Cl.
*H03L 7/06* (2006.01)

(52) U.S. Cl. ........................ 327/147; 327/156

(58) Field of Classification Search ........... 327/147, 327/156, 162, 163; 331/1 A, 17, 25, DIG. 2; 375/373, 375, 376
See application file for complete search history.

(56) References Cited

U.S. PATENT DOCUMENTS

| | | | |
|---|---|---|---|
| 5,223,931 A * | 6/1993 | Fernsler et al. | 348/540 |
| 6,483,361 B1 | 11/2002 | Chiu | 327/159 |
| 6,642,747 B1 | 11/2003 | Chiu | 327/40 |
| 6,795,043 B1 * | 9/2004 | Shibata | 345/13 |

OTHER PUBLICATIONS

National Semiconductor Corporation, "Video Sync Separator", LMM1881, LM1881-X, Jun. 2003, pp. 1-12.

* cited by examiner

*Primary Examiner*—Linh My Nguyen
(74) *Attorney, Agent, or Firm*—Darby & Darby PC; Matthew M. Gaffney

(57) ABSTRACT

A circuit for horizontal deflection includes a first PLL circuit that is arranged to provide a first PLL output signal, and a second PLL circuit that is arranged to provide a second PLL output signal. A first PLL circuit is arranged to provide equalizing pulse removal. The first PLL circuit includes a gated PFD and an equalization pulse removal logic circuit. The equalization pulse removal logic circuit is arranged such that, if equalizing pulses occur in a sync signal, the gated PFD is gated during each equalizing pulse. The second PLL circuit is arranged to provide a wide capture range, and to lock a center of a pulse of the center of the feedback signal with the leading edge of the first PLL output signal. The second PLL circuit includes a frequency comparator circuit, a PFD, and a phase detector. The frequency comparator circuit is arranged to select either the PFD or the phase detector.

19 Claims, 19 Drawing Sheets

CIRCUIT FOR TWO PLLS FOR HORIZONTAL DEFLECTION

FIELD OF THE INVENTION

The invention is related to phase-locked loops, and in particular, to a circuit with two phase-lacked loops cascaded for horizontal deflection.

BACKGROUND OF THE INVENTION

Video applications such as NTSC, PAL, and HDTV may employ horizontal deflection. Horizontal deflection may be accomplished by employing a phase-locked loop.

Phase-locked loop (PLL) circuits are useful in many electronic systems. For example, PLL circuits may be used for master clock generation for a microprocessor system, clock generation for a sampling clock in an analog-to-digital conversion system, clock generation for data recovery in a low-voltage differential signal (LVDS) driver/receiver system, cathode ray tube (CRT) displays, as well as numerous other applications.

PLL applications typically provide an output clock signal by comparing the output clock signal to a reference clock signal. A phase-frequency detector (PFD) circuit is often employed to provide a raw control signal to a loop filter. The phase-frequency detector circuit provides the raw control signal in response to comparing the phase and frequency of the output clock signal to the reference clock signal. The loop filter often is a low-pass filter (LPF) that is arranged to provide a smoothed or averaged control signal in response to raw control signal. Typically, a voltage-controlled oscillator (VCO) is arranged to receive the control signal from the loop filter. The VCO produces the clock signal in response to the control signal such that the frequency of the clock is varied until the phase and frequency of the clock signal are matched to the reference clock signal.

A PLL circuit may include a PFD circuit that provides UP and DOWN signals in response to the comparison between the output clock signal and the reference clock signal. The UP and DOWN signals are dependent on both the phase and frequency of the output and reference clock signals. The UP signal is active when the frequency of the output clock signal is lower than the reference signal, while the DOWN signal is active when the frequency of the output clock signal is determined to be higher than the reference signal. Similarly, the UP signal is active when the phase of the output clock is lagging behind the phase of the reference clock, and the DOWN signal is active when the phase of the output clock is leading the phase of the reference clock.

BRIEF DESCRIPTION OF THE DRAWINGS

Non-limiting and non-exhaustive embodiments of the present invention are described with reference to the following drawings, in which.

DETAILED DESCRIPTION

Figure 1:
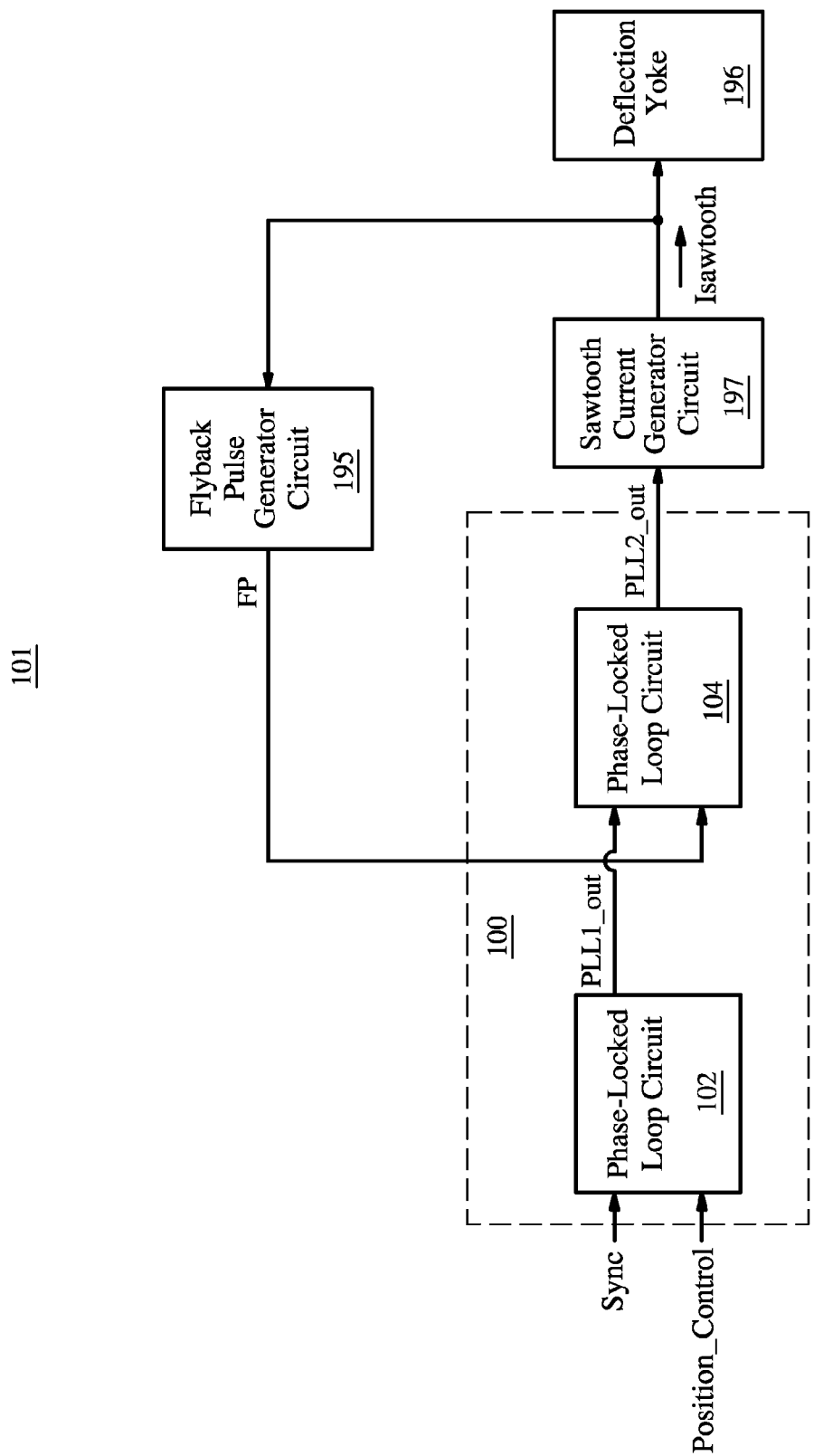
FIG. 1 shows a block diagram of a system that includes a circuit for horizontal deflection which includes two phase-locked loop circuits.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to a circuit for horizontal deflection that includes a first PLL circuit that is arranged to provide a first PLL output signal, and further includes a second PLL circuit that is arranged to provide a second PLL output signal. A first PLL circuit is arranged to provide equalizing pulse removal. The first PLL circuit includes a gated PFD and an equalization pulse removal logic circuit. The equalization pulse removal logic circuit is arranged such that, if equalizing pulses occur in a sync signal, the gated PFD is gated during each equalizing pulse. The second PLL circuit is arranged to provide a wide capture range, and to lock a center of a pulse of the center of the feedback signal with the leading edge of the first PLL output signal. The second PLL circuit includes a frequency comparator circuit, a PFD, and a phase detector. The frequency comparator circuit is arranged to select either the PFD or the phase detector.

FIG. 1 shows a block diagram of system 101, which includes horizontal deflection circuit 100, sawtooth current generator circuit 197, deflection yoke 196, and flyback pulse generator circuit 195. Horizontal deflection circuit 100 includes first PLL circuit 102 and second PLL circuit 104.

PLL circuit 102 is arranged to provide signal PLL1_out based, in part, on signal Sync. Signal Sync may be a composite sync signal, such as an NTSC composite sync signal, or the like. In one embodiment, signal PLL1_out is also based on picture adjustment control signal Position_control. Further, PLL circuit 102 may be arranged to for equalizing pulse removal.

PLL circuit 104 may be arranged to provide signal PLL2_out based, in part, on signal PLL1_out and flyback pulse signal FP. Additionally, sawtooth current generator circuit 197 may be arranged to provide sawtooth current Isawtooth from signal PLL2_out. Current Isawtooth has a slow rise time and a fast fall time. In one embodiment, at least a portion of current Isawtooth is provided to deflection yoke 196. Deflection yoke 196 may be included in a CRT display for horizontal deflection of the CRT display. Also, in one embodiment, at least a portion of current Isawtooth is provided to flyback pulse generator circuit 195.

Flyback pulse generator circuit 195 may be arranged to provide flyback pulse signal FP from the at least the portion of current Isawtooth that is received by flyback pulse generator circuit 195. Signal FP may be substantially similar to signal PLL2_out, except that signal FP has a low duty cycle, and has a temperature-dependent propagation delay relative to signal PLL2_out.

Figure 2:
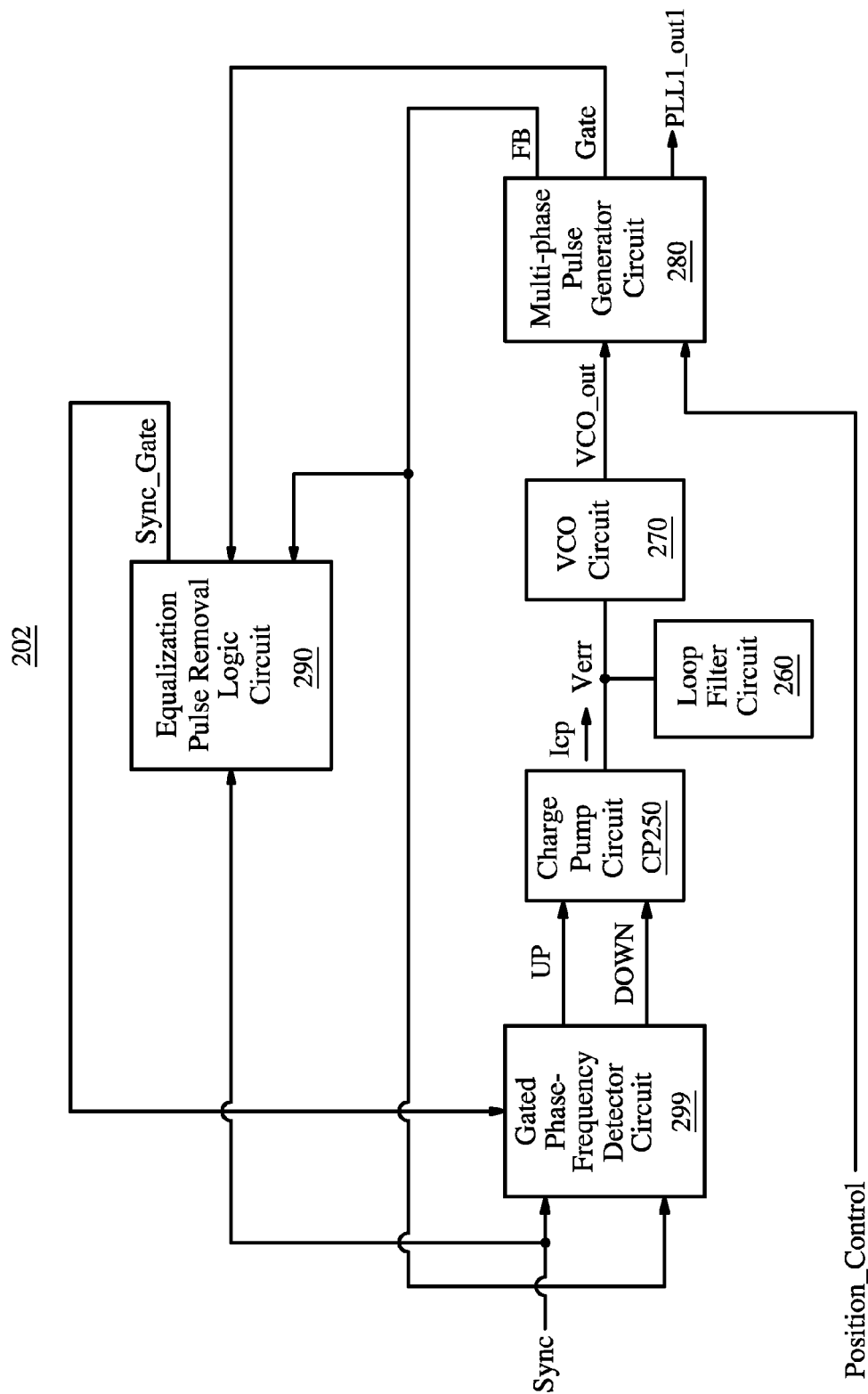
FIG. 2 illustrates a block diagram of an embodiment of the first phase-locked loop circuit of FIG. 1.

FIG. 2 illustrates a block diagram of an embodiment of PLL circuit 202. PLL circuit 202 includes components such as gated phase-frequency detector circuit 299, charge pump circuit CP250, loop filter circuit 260, VCO circuit 270, multi-phase generator circuit 280, and equalizing pulse removal logic circuit 290.

Gated phase-frequency detector circuit 299 may be arranged to provide signals UP and DOWN based, in part, on sync signal Sync, feedback signal FB, and sync gate signal Sync_gate.

Further, gated phase-frequency detector circuit 299 may be arranged such that, if signal Sync_gate corresponds to an active logic level, gated phase-frequency circuit 210 provides signals UP and DOWN in substantially the same manner as a phase-frequency detector. However, gated phase-frequency detector circuit 299 is further arranged such that, if signal Sync_gate corresponds to an inactive logic level, a logic level that is associated with signal UP remains the same, regardless of signal Sync.

In one embodiment, a flip-flop (not shown in FIG. 2) in gated phase-frequency detector circuit 299 is triggered on the rising edges of signal Sync if signal Sync_gate corresponds to an active logic level. In this embodiment, if signal Sync_gate corresponds to an inactive logic level, rising edges of signal Sync are ignored by gated phase-frequency detector circuit 299.

In another embodiment, a flip-flop (not shown in FIG. 2) in gated phase-frequency detector circuit 299 is triggered on the falling edges of signal Sync if signal Sync_gate corresponds to an active logic level. In this embodiment, if signal Sync_gate corresponds to an inactive logic level, falling edges of signal Sync are ignored by gated phase-frequency detector circuit 299.

Also, charge pump circuit CP250 may be configured to provide charge pump current Icp responsive to signals UP and DOWN. Loop filter circuit 260 may be arranged to provide error signal Verr in response to current Icp. VCO circuit 270 is arranged to provide oscillator output signal VCO_out from signal Verr.

Multi-phase pulse generator circuit 280 may be arranged to provide signal FB by dividing a frequency that is associated with signal VCO_out. In one embodiment, multi-phase pulse generator circuit 280 is arranged to provide signal FB such that signal FB has a period of approximately 63.5 μs. Multi-phase pulse generator circuit 280 may be further arranged to provide signals Gate and PLL1_out such that signals Gate and PLL1_out have substantially the same frequency as signal FB, but different phases than signal FB. In one embodiment, the phase of signal PLL1_out is adjustable based on signal Position_control, and the phase of signal Gate leads the phase of signal FB by approximately 90 degrees (i.e. one-fourth of a period).

Equalizing pulse removal logic circuit 290 is arranged to provide signal Sync_gate based, in part, on signals FB, Gate, and Sync. Equalizing pulse removal circuit 290 may arranged to provide signal Sync such that, if equalizing pulses are occurring in signal Sync, every other pulse in signal Sync is ignored by gated phase-frequency detector circuit 299. Accordingly, each of the equalizing pulses may be ignored by gated phase-frequency detector circuit 210. In one embodiment, equalizing pulse removal circuit 290 is arranged to provide signal Sync_gate such that signal Sync_gate is substantially the same as signal Gate if signal FB is locked to signal Gate.

The composite sync signal includes a horizontal sync region with a period of about 63.5 μs. During a vertical blanking interval, the composite sync signal still includes the horizontal sync pulses with a period of about 63.5 μs. However, during the vertical blanking period, equalizing pulses are interleaved with the horizontal sync pulses. The equalizing pulses have a period of about 63.5 μs, and lag behind the horizontal sync pulses by about 31.75 μs (or 31.8 μs, rounding to three significant digits). Accordingly, the period of the NTSC composite sync signal is approximately 31.8 μs during the vertical blanking period. Equalizing pulse removal logic circuit 290 may be arranged such that, if the period of signal Sync is about 31.8 μs, gated phase-frequency detector circuit 299 ignores half of the pulses in signal Sync, so that the period of signal Out remains unchanged (e.g. remains at about 63.5 μs) even if equalizing pulses occur in signal Sync.

Figure 3:
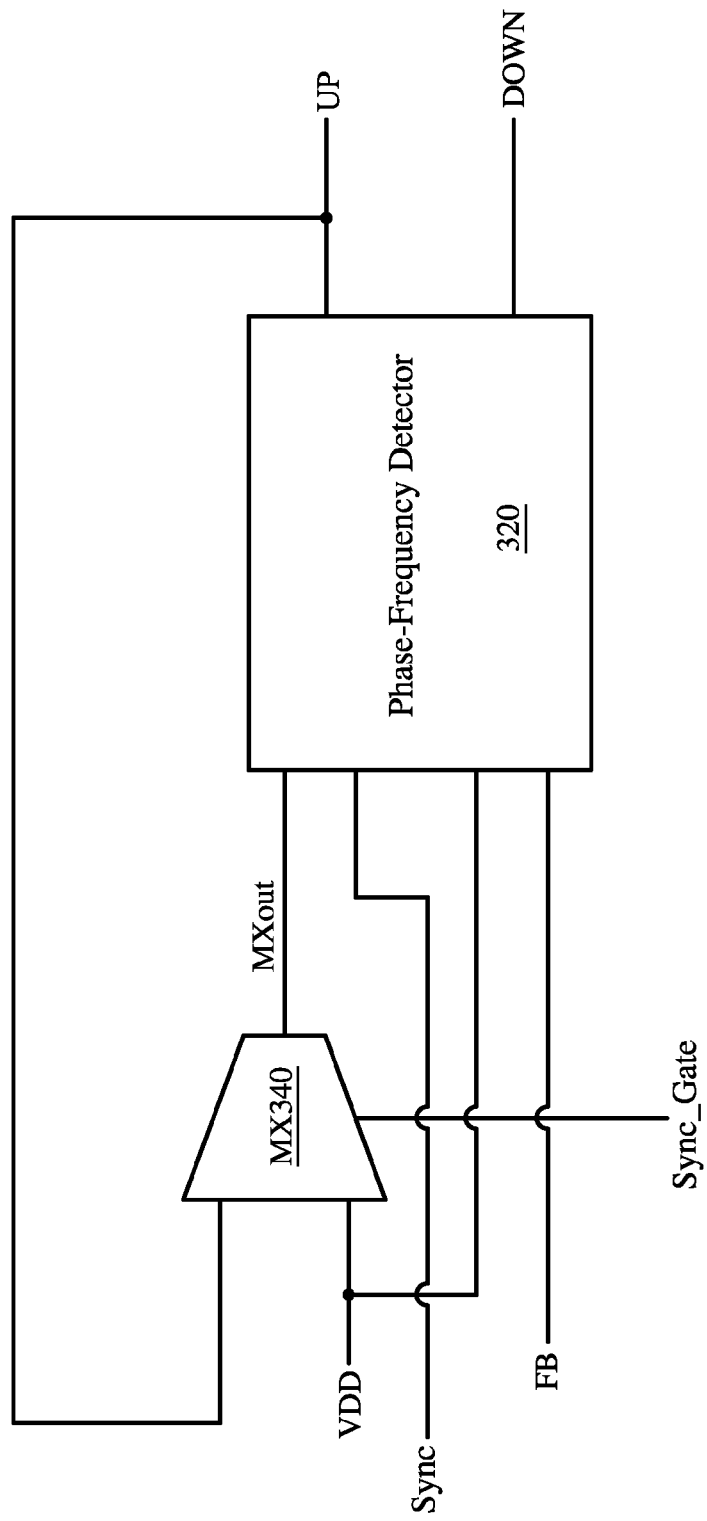
FIG. 3 shows a block diagram of an embodiment of the gated phase-frequency detector circuit of FIG. 2.

FIG. 3 shows a block diagram of an embodiment of gated phase-frequency detector circuit 399. Gated phase-frequency detector circuit 399 may operate in a substantially similar manner to gated phase-frequency detector circuit 299 of FIG. 2, and may operate in a different manner in some ways. Gated phase-frequency detector circuit 399 includes multiplexer circuit MX340 and phase-frequency detector (PFD) 320.

PFD 320 may be arranged to provide signals UP and DOWN at up and down outputs respectively of PFD 320 based, in part, on the phases and frequencies of signals Sync and FB. PFD 320 may be arranged to receive: signal MXout at a first detector input, signal VDD at a second detector input, signal Sync at a reference input, and signal FB at a feedback input.

Multiplexer circuit MX340 may be arranged to receive signal UP at a first multiplexer input, to receive signal VDD at a second multiplexer input, and to receive signal Sync_gate at a select multiplexer input. Also, multiplexer circuit MX340 may be arranged to provide multiplexer output signal MXout at a multiplexer output of multiplexer circuit MX340 by multiplexing signals UP and VDD based on signal Sync_gate. Accordingly, multiplexer circuit MX340 may be arranged to provide signal MXout such that signal MXout corresponds to a logic high if signal Sync_gate corresponds to an active logic level, and such that signal MXout corresponds to a logic level that is associated with signal UP if signal Sync_gate corresponds to an inactive logic level.

Although multiplexer circuit MX340 is shown as receiving signal VDD, multiplexer circuit MX340 may instead receive virtually any signal that provides a logic "high" instead of VDD. Also, in other embodiment, multiplexer 340 may instead receive virtually any signal that provides a logic "low".

Figure 4:
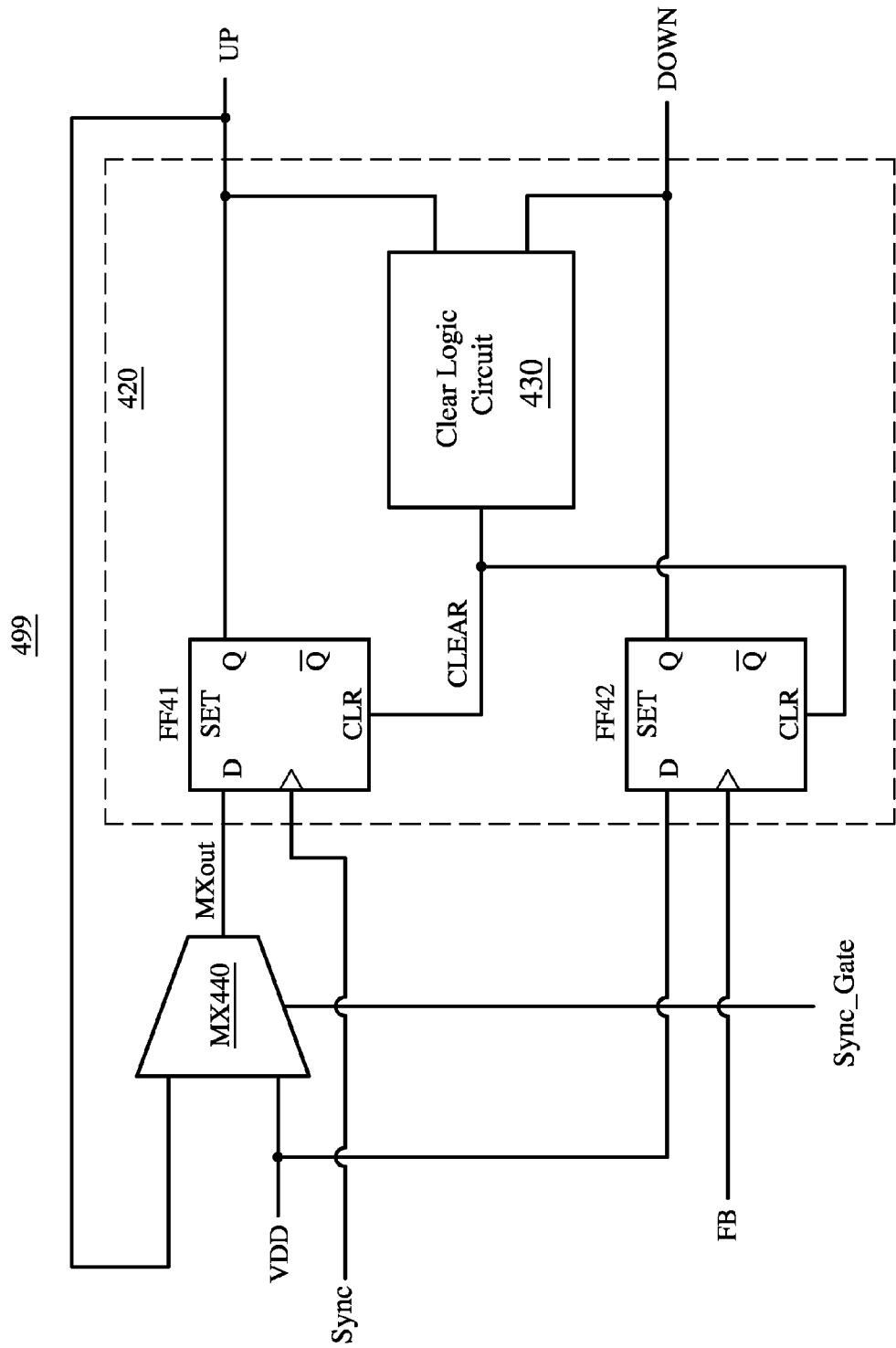
FIG. 4 illustrates a block diagram of an embodiment of the gated phase-frequency detector circuit of FIG. 3 in which an embodiment of the phase-frequency detector of FIG. 3 is shown.

FIG. 4 illustrates a block diagram of an embodiment of gated phase-frequency detector circuit 499, in which an embodiment of a PFD is shown. Components in gated phase-frequency detector circuit 499 may operate in a substantially similar manner to similarly-named components in gated phase-frequency detector circuit 399 of FIG. 3, and may operate in a different manner in some ways. PFD 420 includes flip-flops FF41 and FF42, and clear logic circuit 430.

Flip-flop FF41 may be arranged to receive signal MXout at a D input, to receive signal Sync at a clock input, to receive signal CLEAR at a clear input, and to provide signal UP at a Q output. Also, flip-flop FF42 may be arranged to receive signal VDD at a D input, to receive signal FB at a clock input, to receive signal CLEAR at a clear input, and to provide signal DOWN at a Q output. Clear logic circuit 430 is arranged to provide signal CLEAR based, in part, on signals UP and DOWN.

Clear logic circuit 430 may be arranged to provide signal CLEAR by employing an AND function on signals UP and DOWN. Accordingly, clear logic circuit 430 may be arranged to provide signal CLEAR such that the signals UP and DOWN are reset if signals UP and DOWN both correspond to a high logic level.

In other embodiments, complementary logic may be employed such that clear logic circuit provides a NOR function on signals UP and DOWN such that signals UP and DOWN are reset if signal UP and DOWN both correspond to a low logic level.

Although D flip-flops are illustrated in FIG. 4, types of memory circuits other than D flip-flops may be employed in PFD 420, such as SR flip-flops, JK flip-flops, T flip-flops, latches, and the like.

Figure 5:
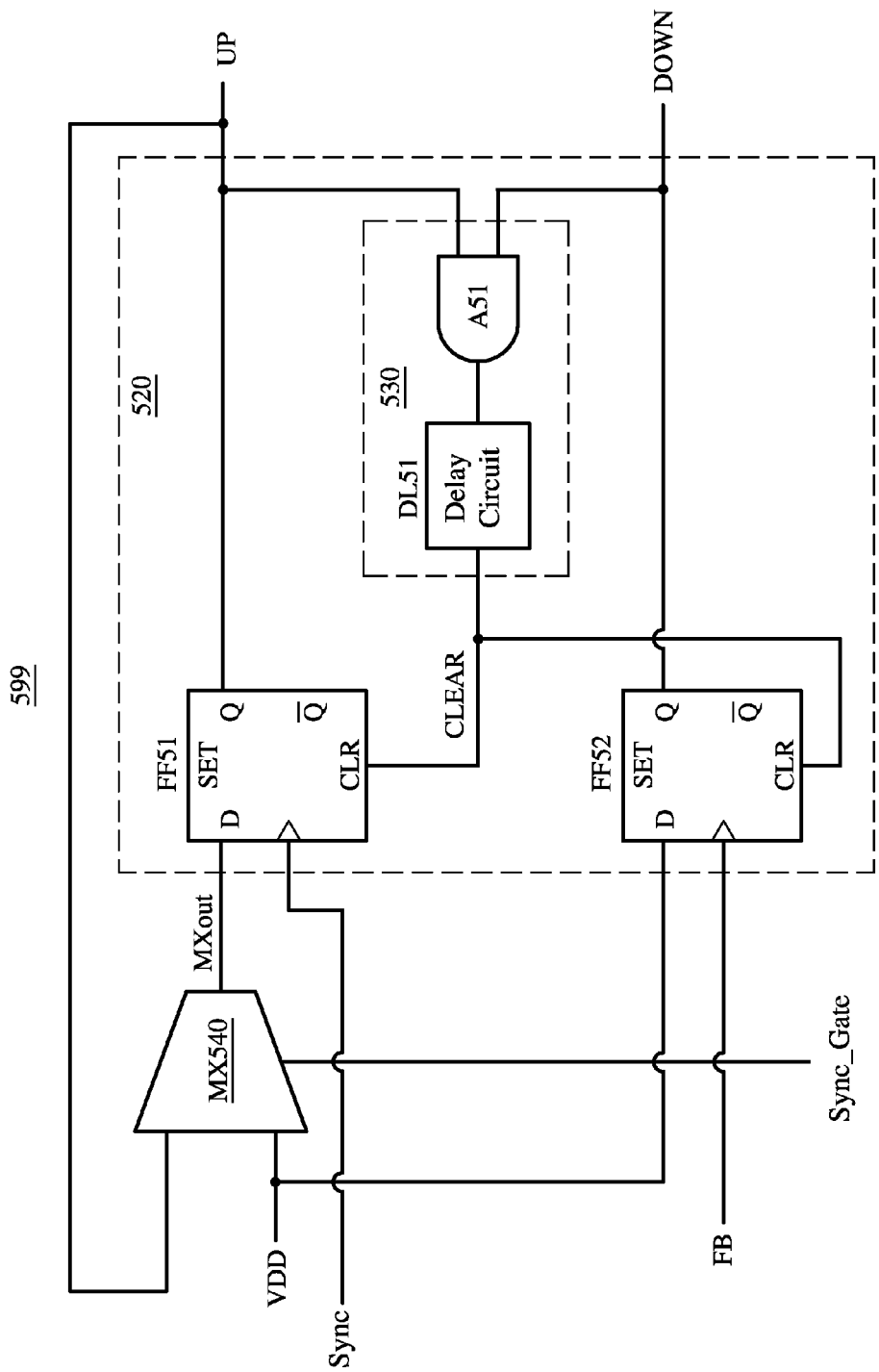
FIG. 5 shows a block diagram of an embodiment of the gated phase-frequency detector circuit of FIG. 4 in which an embodiment of the clear logic circuit of FIG. 4 is shown.

FIG. 5 shows a block diagram of an embodiment of gated phase-frequency detector circuit 599, in which an embodiment of a clear logic circuit is shown. Components in gated phase-frequency detector circuit 599 may operate in a substantially similar manner to similarly-named components in gated phase-frequency detector circuit 499 of FIG. 4, and may operate in a different manner in some ways. Clear logic circuit 530 includes AND gate A51 and delay circuit D51.

Figure 6:
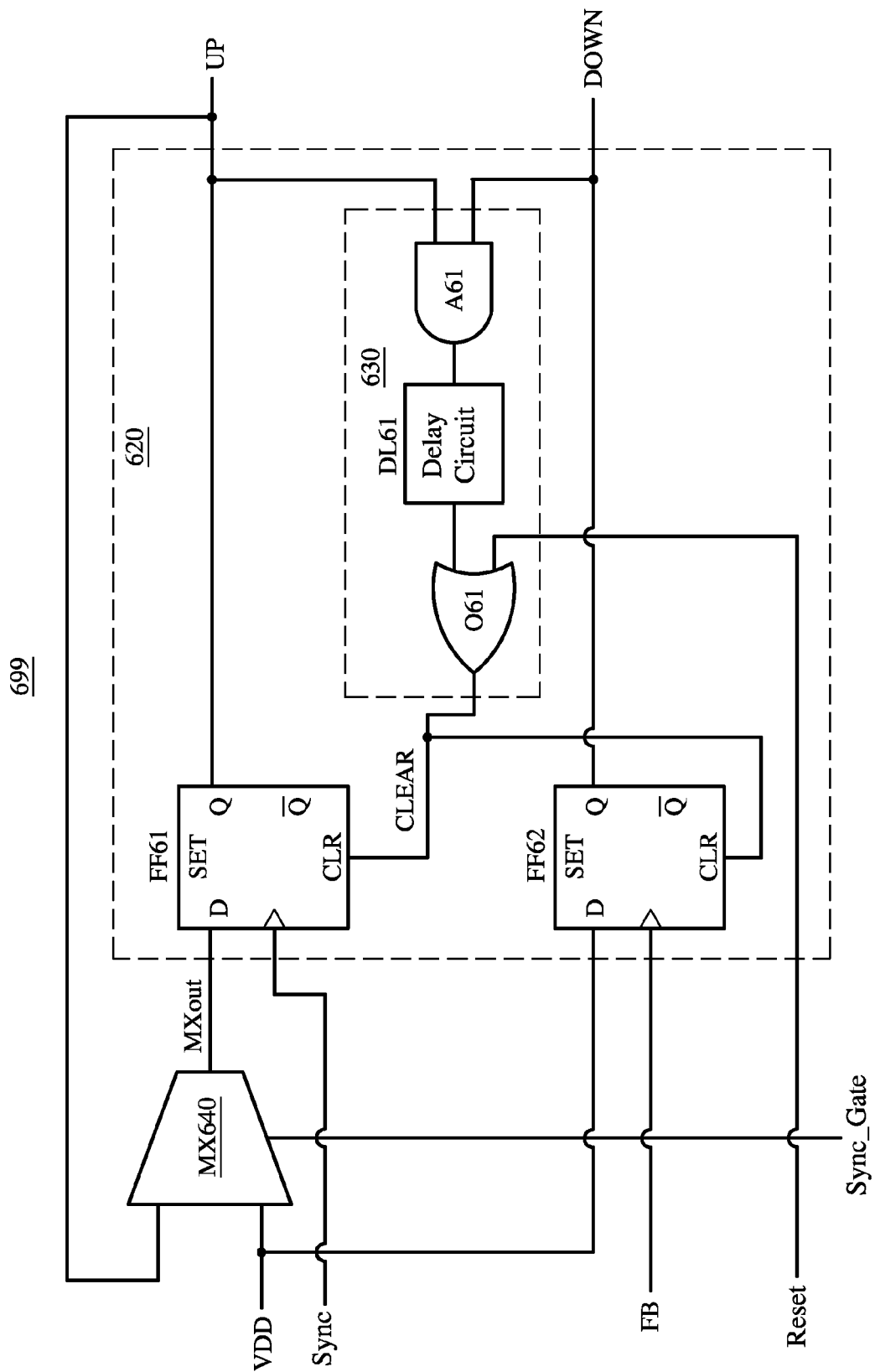
FIG. 6 illustrates a block diagram of an embodiment of the gated phase-frequency detector circuit of FIG. 4 in which another embodiment of the clear logic circuit of FIG. 4 is shown.

FIG. 6 illustrates a block diagram of an embodiment of gated phase-frequency detector circuit 699, in which another embodiment of a clear logic circuit is shown. Components in gated phase-frequency detector circuit 699 may operate in a substantially similar manner to similarly-named components in gated phase-frequency detector circuit 499 of FIG. 4, and may operate in a different manner in some ways. Clear logic circuit 630 includes AND gate A61, delay circuit D61, and OR gate O61.

Figure 7:
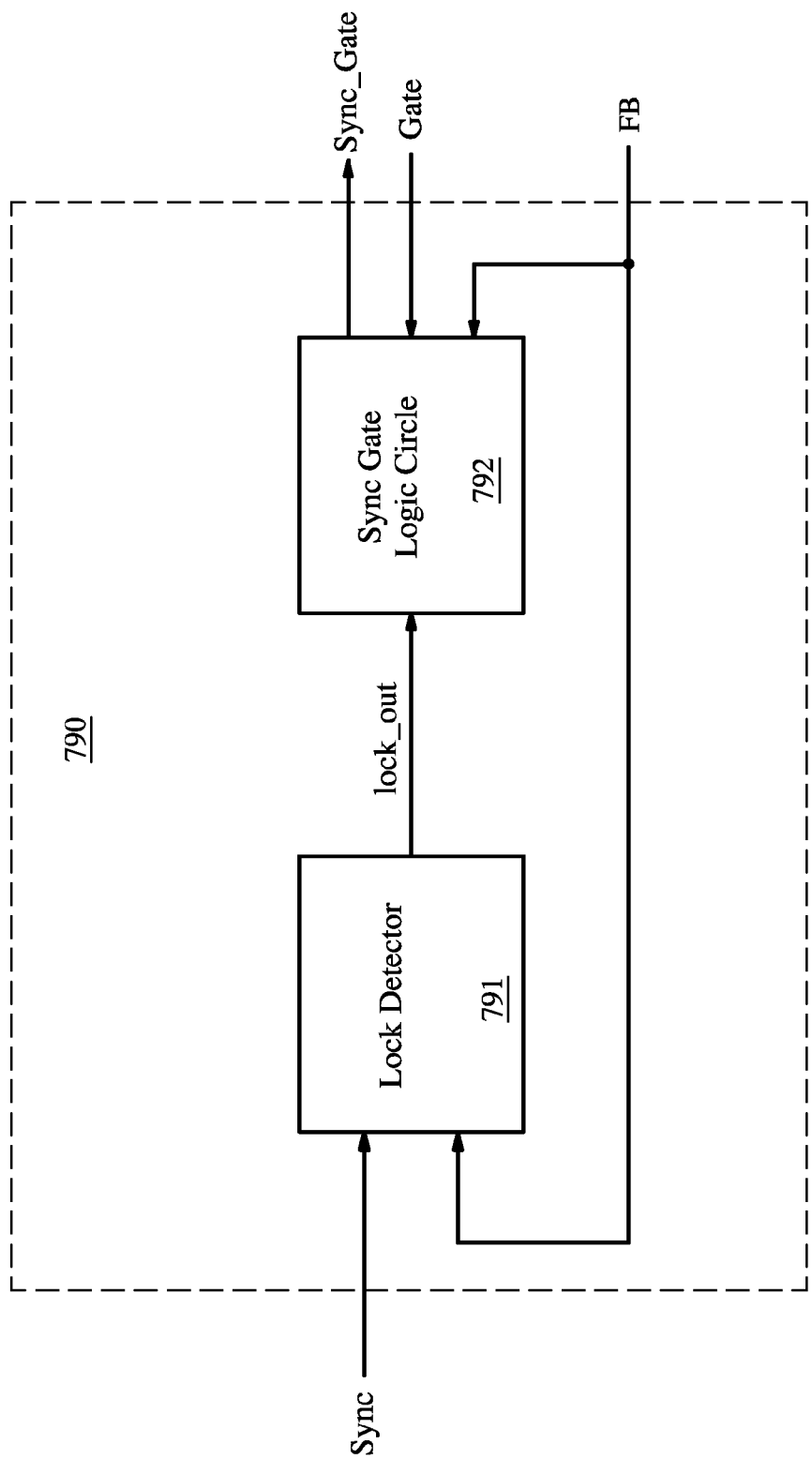
FIG. 7 shows a block diagram of an embodiment of the equalizing pulse removal logic circuit of FIG. 2.

FIG. 7 shows a block diagram of an embodiment of equalizing pulse removal logic circuit 790. Equalizing pulse removal logic circuit 790 may operate in a substantially similar manner to equalizing pulse removal logic circuit 290 of FIG. 2, and may operate in a different manner in some ways. Equalizing pulse removal logic circuit 790 includes lock detector 791 and sync gate logic circuit 792.

Lock detector 791 is arranged to determine whether phases associated with signals Sync and FB are substantially the same, and to provide signal lock_out based on the determination. Accordingly, signal lock_out corresponds to a first logic level (e.g. high) if signals Sync and FB have substantially the same phase, corresponds to a second logic level (e.g. low) otherwise. Signals Sync and FB are said to be locked if their phases are substantially the same.

Additionally, sync gate logic circuit 792 is arranged to provide signal Sync_gate based, in part, on signal lock_out, signal Gate, and signal FB. In one embodiment, sync gate logic circuit 792 is arranged to provide signal Sync_gate such that signal Sync_gate corresponds to an active logic level (e.g. high) if signal lock_out corresponds to an inactive logic level (e.g. low), and such that signal Sync_gate also corresponds to the active logic level if signal Gate corresponds to the first logic level (e.g. high). Sync_gate logic circuit 792 may be arranged to provide signal Sync_gate such that signal Sync_gate corresponds to an active logic level under another condition that indicates that no equalizing pulses are occurring in signal Sync. Embodiments of sync gate logic circuit 792 are shown in greater detail with respect to FIGS. 9 and 10 below.

Figure 8:
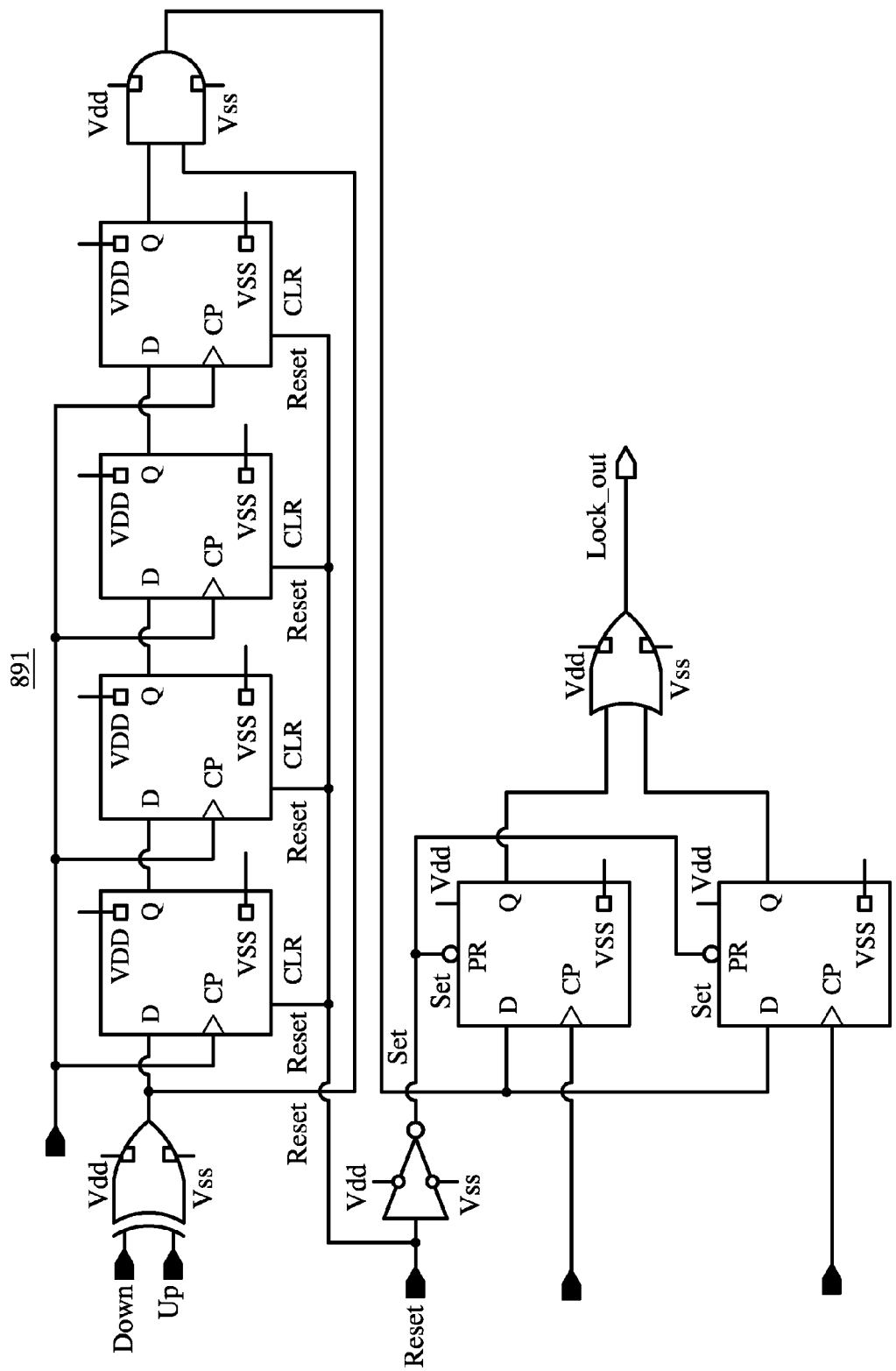
FIG. 8 illustrates a block diagram of an embodiment of the lock detector of FIG. 7.

FIG. 8 illustrates a block diagram of an embodiment of lock detector 891. Lock detector 891 may operate in a substantially similar manner to lock detector 791 of FIG. 7, and may operate in a different manner in some ways. Although the embodiment of lock detector 891 illustrated in FIG. 8 employs signals reset, VCO_out, UP and DOWN, other embodiments of lock detector 891 need not employ these signals.

Figure 9:
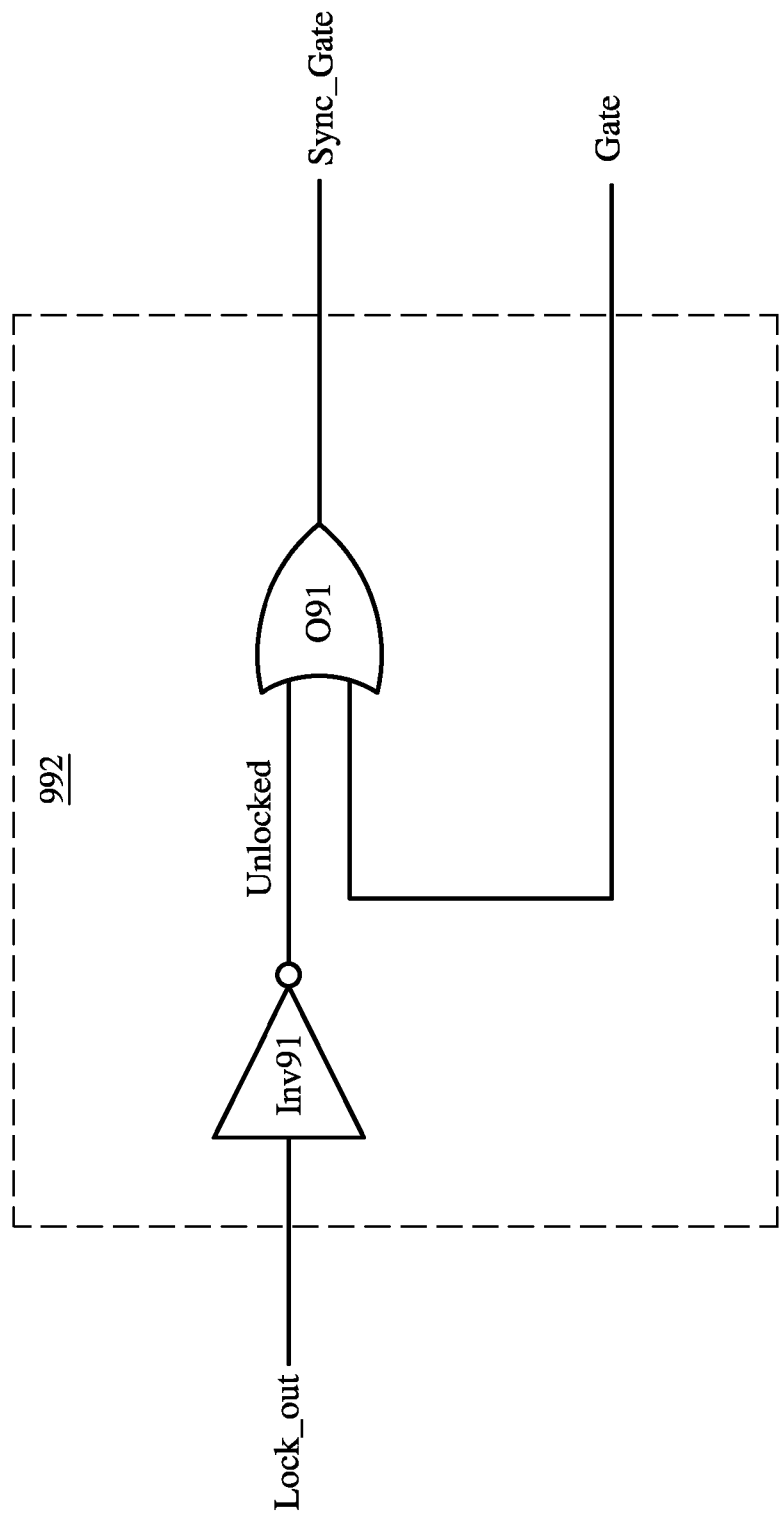
FIG. 9 shows a block diagram of an embodiment of the sync gate logic circuit of FIG. 7.

FIG. 9 shows a block diagram of an embodiment of sync gate logic circuit 992. Sync_gate logic circuit 992 may operate in a substantially similar manner as sync gate logic circuit 792 of FIG. 7, and may operate in a different manner in some ways. Sync gate logic circuit 992 includes inverter Inv91 and OR gate O91.

Inverter Inv91 is arranged to provide signal Unlocked from signal lock_out by inverting signal lock_out. OR gate O91 is arranged to provide signal Sync_gate by performing an OR function on signals Unlocked and Gate. Accordingly, when signals FB and Gate are locked, signal Sync_gate is substantially the same as signal Gate. If signal Sync is an NTSC composite sync signal and signals Sync and FB are locked, then during the horizontal sync interval, whenever signal Sync is high, signal Sync_gate is also high. However, if signal Sync has a period of about 31.8 µs, as when equalizing pulses occur in signal Sync, then signal Sync_gate may be low during half of the pulses in signal Sync.

Figure 12:
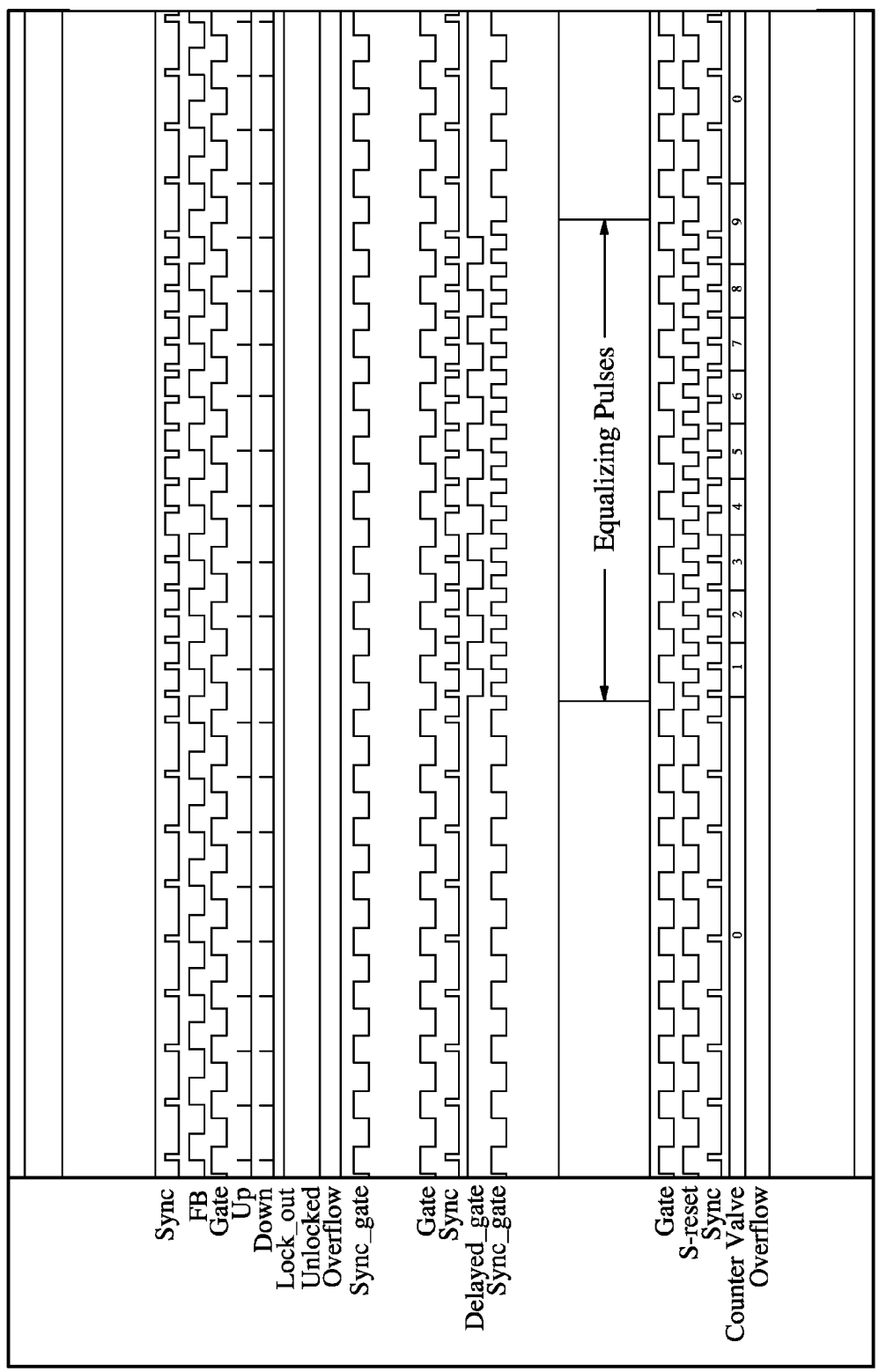
FIG. 12 illustrates a timing diagram of waveforms of embodiments of signals for an embodiment of the first phase-locked loop circuit of FIG. 1.

Accordingly, the gated phase-frequency detector circuit (e.g. gated phase-frequency detector circuit 299 of FIG. 2) may ignore the equalizing pulses. Waveforms of embodiments of signals Sync, Gate, Sync_gate, and FB are illustrated in FIG. 12, which is discussed in greater detail below.

Figure 10:
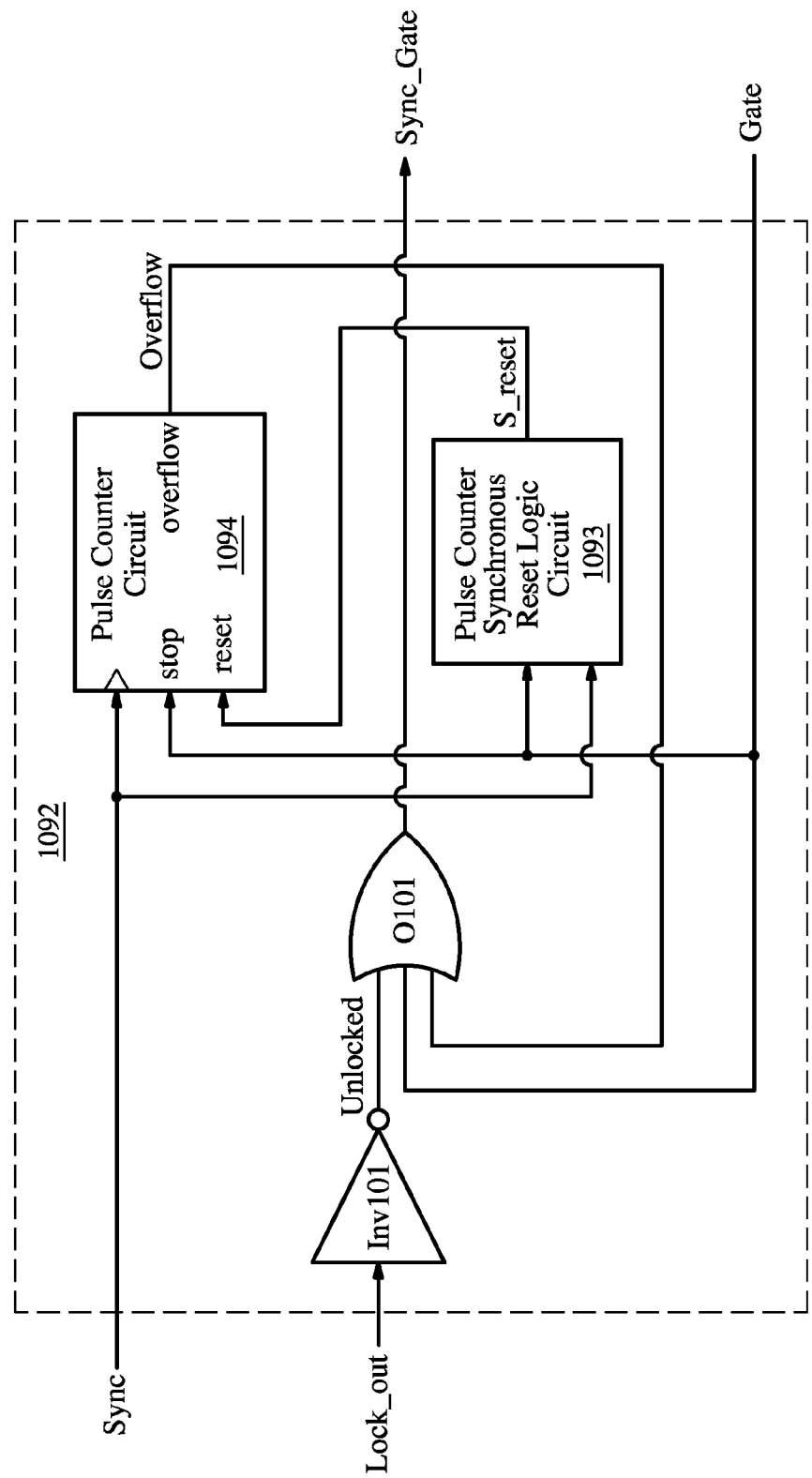
FIG. 10 illustrates a block diagram of another embodiment of the sync gate logic circuit of FIG. 7.

FIG. 10 illustrates a block diagram of sync gate logic circuit 1092. Sync gate logic circuit 1092 may operate in a substantially similar manner as sync gate logic circuit 792 of FIG. 7, and may operate in a different manner in some ways. Sync gate logic circuit 1092 includes inverter Inv101, three-input OR gate O101, pulse counter circuit 1094, and pulse counter synchronous reset logic circuit 1093.

Inverter Inv101 is configured to provide signal Unlocked from signal lock_out. OR gate O101 is arranged to provide signal Sync_gate from signals Unlocked, Gate, and Overflow.

Pulse counter circuit 1094 is arranged to receive signal Gate at a stop input so that, when signal Sync corresponds twice the horizontal sync NTSC frequency, half of the pulses are counted. In another embodiment, a stop input may not be employed, so that all of the pulses are counted.

Pulse counter circuit 1094 may be arranged such that signal overflow is asserted if a large number of pulses occur in signal Sync that are at approximately twice the horizontal sync NTSC frequency. Sync gate logic circuit 1092 is configured to provide signal Sync_gate so that signal Sync_gate is substantially the same as signal Gate if equalizing pulses are occurring in signal Sync. However, if signal Sync is a progressive scan signal, or the like, pulses in signal Sync may have a similar frequency as when interleaved equalizing pulses occur in signal Sync. If signal Sync is a progressive scan signal, it is preferable to not ignore any pulses in signal Sync, even though the frequency of signal Sync is substantially the same as the frequency as when interleaved equalizing pulses occur in signal Sync. Accordingly, if a large number of pulses (e.g. more than 9) occur at approximately twice the horizontal sync NTSC frequency, then the pulses are probably not equalizing pulses, but instead are probably pulses from a progressive scan signal, or the like. Accordingly, if a large number of pulses occur at approximately twice the horizontal sync NTSC frequency, sync gate logic circuit 1092 provides signal Sync_out at an active logic level.

Pulse counter circuit 1094 is a counter circuit that is arranged to increment a value if a rising edge occurs in signal Sync while signal Gate is low and signal S_reset is inactive (e.g. low). Pulse counter circuit 1094 is further arranged such that the value resets (e.g. to zero) if signal S_reset is active (e.g. high) when a rising edge occurs in signal Sync. Also, pulse counter circuit 1094 is arranged to assert signal Overflow if the value overflows. In one embodiment, pulse counter circuit 1094 is a five-bit counter, and the value overflows if the value reaches 31 before being reset. In other embodiments, pulse counter circuit 1094 may have a number of bits other than five.

Additionally, pulse counter circuit 1094 is arranged to reset responsive to signal S_reset when signal Sync resumes the horizontal sync NTSC frequency. Pulse counter reset logic circuit 1093 is arranged to provide signal S_reset based, in part, on signals Sync and Gate.

Figure 11:
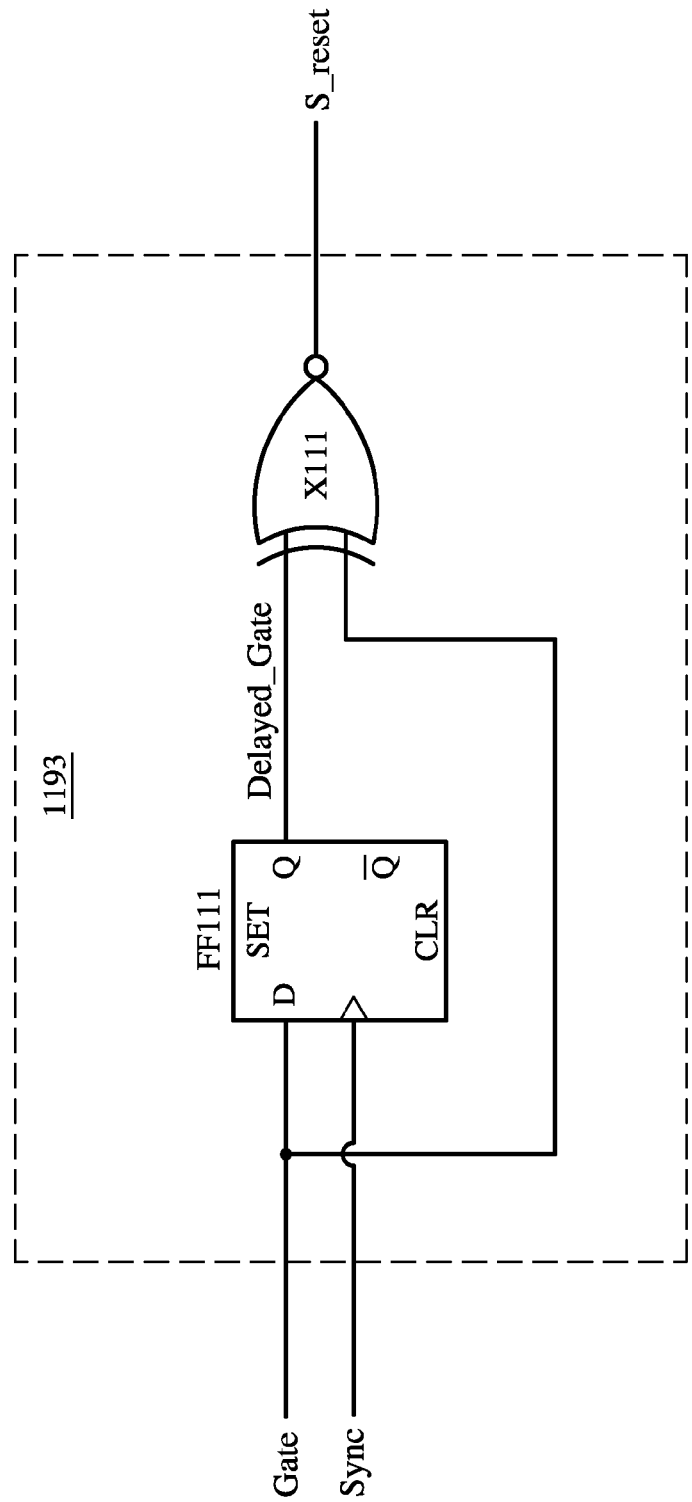
FIG. 11 shows a block diagram of an embodiment of the pulse counter synchronous reset logic circuit of FIG. 10.

FIG. 11 shows a block diagram of an embodiment of pulse counter synchronous reset logic circuit 1193. Pulse counter synchronous reset logic circuit 1193 is arranged to operate in a substantially similar manner to pulse counter synchronous reset logic circuit 1093 of FIG. 10, and may operate in a different manner in some ways. Pulse counter synchronous reset logic circuit 1193 includes flip-flop FF111 and XNOR gate X111.

Flip-flop FF111 is arranged to provide signal Delayed_gate from signals Gate and Sync. Additionally, XNOR gate O111 is arranged to provide signal S_reset from signals Delayed_gate and Gate. Timing of signals in FIG. 11 may be more easily understood with reference to FIG. 12 below.

FIG. 12 illustrates a timing diagram of waveforms of embodiments of signals for an embodiment of a phase-locked loop circuit that is arranged in accordance with aspects of the invention.

For the waveforms illustrated in FIG. 12, signals Sync and FB are locked, and signal Unlocked corresponds to a logic low accordingly. Signal Gate leads signal FB by approximately 90 degrees, as shown in FIG. 12. Since signal Unlocked corresponds to a logic low, and since signal Overflow is not asserted, signal Sync_gate is substantially the same as signal Gate.

As further shown in FIG. 12, signal Delayed_gate corresponds to a logic high until the equalizing pulses occur. When the equalizing pulses occur, signal Delayed_gate corresponds to a delayed version of signal Gate. Also, signal S_reset may be provided by an XNOR function between signals Delayed_gate and Gate. The frequency of signal S_reset approximately doubles during the equalizing pulses. During the equalizing pulses, signal S_reset is not high on rising edges of signal Sync, so that pulse counter circuit 1094 is not reset during the equalizing pulses.

Further, as shown in FIG. 12, the counter value (e.g. the value of pulse counter circuit 1094) increments on a rising edge of signal Sync if signals Gate and S_reset are both low. Accordingly, the counter value increments at every other pulse in signal Sync. When the equalizing pulses end, signal S_reset is high during the next rising edge of signal Sync. Accordingly, the counter value resets to zero when the equalizing pulses end.

Figure 13:
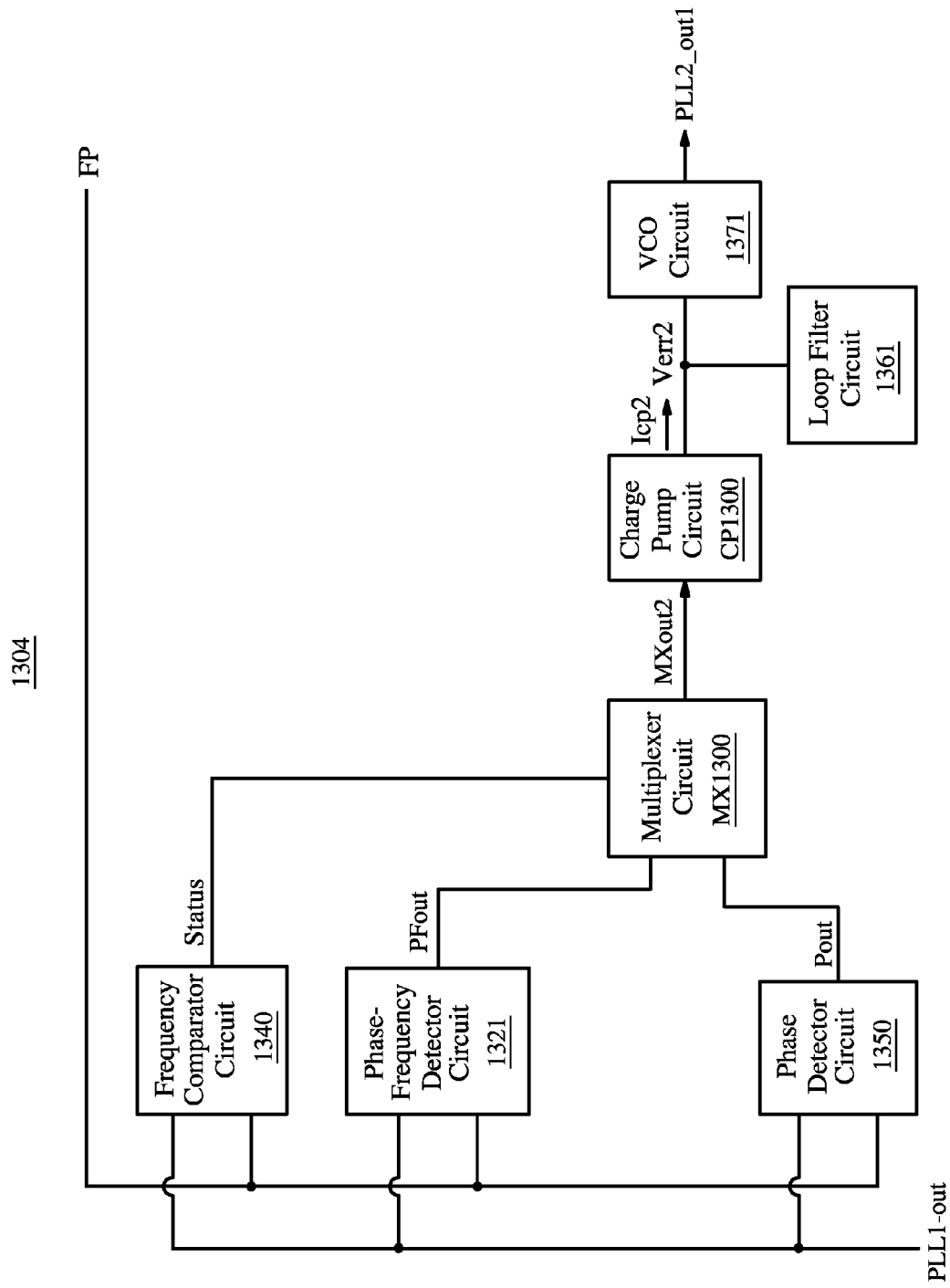
FIG. 13 illustrates a block diagram of an embodiment of the second phase-locked loop circuit of FIG. 1.

FIG. 13 illustrates a block diagram of an embodiment of PLL circuit 1304. PLL circuit 103 may operate in a substantially similar manner to PLL circuit 104 of FIG. 1, and may operate in a different manner in some ways. PLL circuit 1304 includes multiplexer circuit MX1300, charge pump circuit CP1300, loop filter circuit 1361, VCO circuit 1371, frequency comparator circuit 1340, PFD circuit 1321, and phase detector circuit 1350.

Phase detector circuit 1350 is arranged to provide phase detection output signal Pout in response to signal PLL1_out and flyback pulse signal FP. Also, phase detector circuit 1350 may be configured to provide signal Pout such that, if signal Pout is received by charge pump circuit CP1300 and signals PLL1_out and FP are within a capture range of phase detector circuit 1350, then the operation of PLL circuit 1304 adjusts signal FP toward causing a constant phase difference between signals PLL1_out and FP.

Additionally, PFD circuit 1321 is arranged to provide phase-frequency detection output signal PFout in response to signals PLL1_out and FP. PFD circuit 1321 may be configured to provide signal PFout such that, if signal PFout is receive by charge pump circuit CP1300, the operation of PLL circuit 1304 adjusts signal FP towards causing the phase and frequency of signals PLL1_out and FP to become substantially the same.

Frequency comparator circuit 1340 may be arranged to provide signal Status such that signal Status corresponds to a first logic level if a frequency that is associated with signal PLL1_out and a frequency that is associated with signal FP are within a tolerance window, and such that signal Status corresponds to a second logic level if the frequency that is associated with signal PLL1_out and the frequency that is associated with signal FP are outside of the tolerance window. Further, multiplexer circuit MX1300 is arranged to provide signal MXout2 such that signal PFout is selected as signal MXout2 if signal Status corresponds to the first logic level, and such that signal Pout is selected as signal MXout2 if signal Status corresponds to the second logic level.

Also, charge pump circuit CP1300 is configured to provide charge pump current Icp2 responsive to signal MXout2. Loop filter circuit 1361 is arranged to provide error signal Verr2 in response to current Icp2. VCO circuit 1371 is arranged to provide an oscillator output signal from signal Verr2. In one embodiment, the oscillator output signal is signal PLL2_out. In one embodiment, signal PLL2_out is based, in part, on the oscillator output signal. In any case, signal FP is based, in part, on signal PLL2_out.

Figure 14:
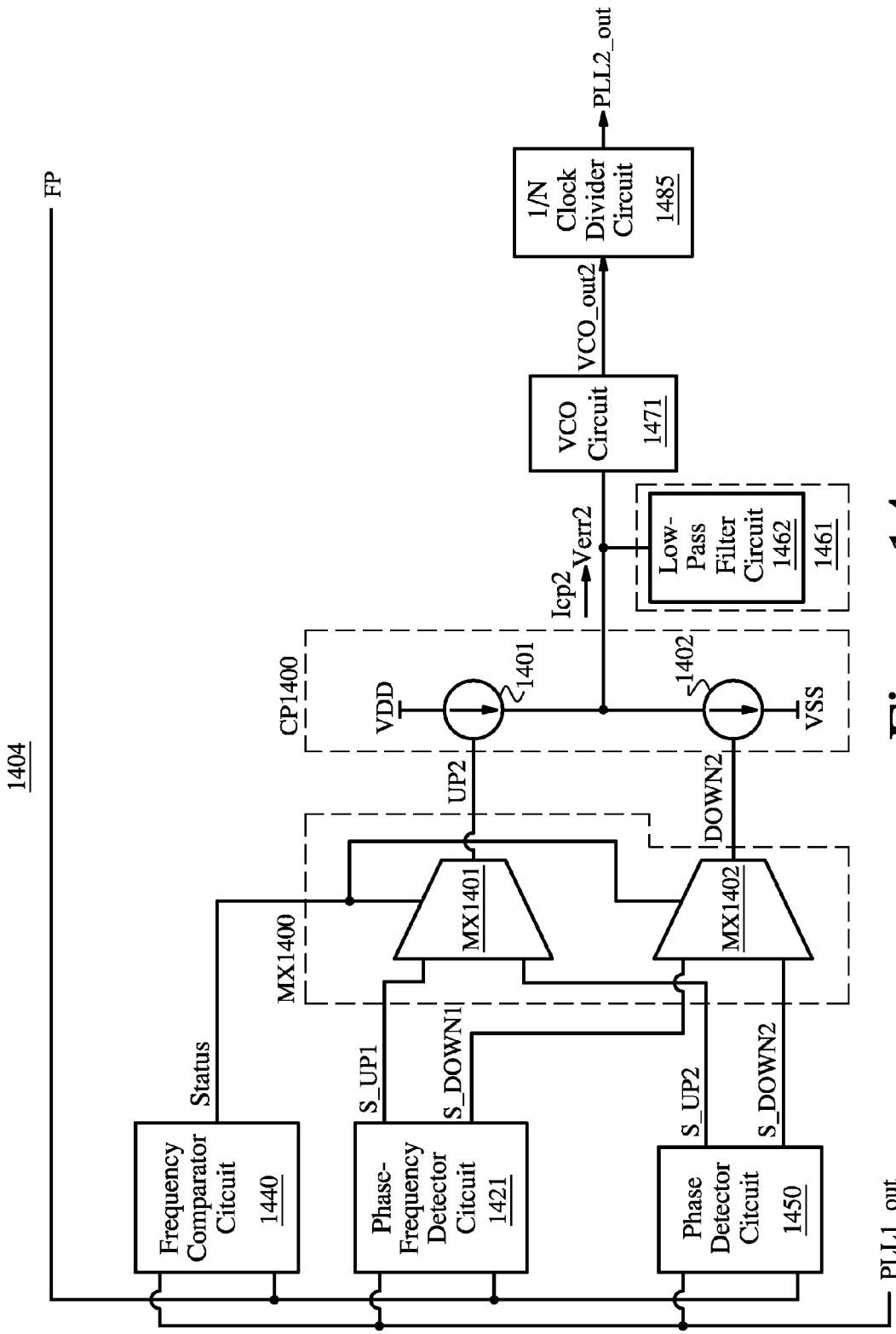
FIG. 14 shows a block diagram of another embodiment of the second phase-locked loop circuit of FIG. 1.

FIG. 14 shows a block diagram of an embodiment of PLL circuit 1404. Components in PLL circuit 1404 may operate in a substantially similar manner to similarly-named components in PLL circuit 1304 of FIG. 13, and may operate in a different manner in some ways. PLL circuit 1404 may further include 1/N clock divider circuit 1485. Multiplexer circuit MX1400 includes multiplexer MX1401 and multiplexer MX1402. Charge pump circuit CP1400 includes current source I1401 and current sink I1402. Loop filter circuit 1461 includes low pass filter circuit 1462.

PFD circuit 1421 is arranged to provide a phase-frequency detection output signal that includes signals S_UP1 and S_DOWN1. Phase detector circuit 1450 is arranged to provide a phase detection output signal that includes signals S_UP2 and S_DOWN2. Phase detector circuit 1450 is arranged to provide signal S_UP2 such that signal S_UP2 corresponds to an active logic level if signal FP corresponds to the second logic level and the input clock signal corresponds to the second logic level, and corresponds to an inactive logic level otherwise. Further, phase detector circuit 1450 is arranged to provide signal S_DOWN2 such that signal S_DOWN2 corresponds to the active logic level if signal FP corresponds to the second logic level and the input clock signal corresponds to the first logic level, and corresponds to the inactive logic level otherwise.

Additionally, multiplexer MX1401 is arranged to multiplex signals S_UP1 and S_UP2 responsive to signal Status, and multiplexer MX1402 is arranged to multiplex signals S_DOWN1 and S_DOWN2 responsive to signal Status. More specifically, signal S_UP2 is selected as signal UP2 by multiplexer MX1401 if signal Status corresponds to the first logic level, and signal S_UP1 is selected as signal UP2 by multiplexer MX1401 if signal Status corresponds to the second logic level. Similarly, signal S_DOWN2 is selected as signal DOWN2 by multiplexer MX1402 if signal Status corresponds to the first logic level, and signal S_DOWN1 is selected as signal DOWN2 by multiplexer MX1401 if signal Status corresponds to the second logic level.

Current source I1401 is arranged to provide a source current as current Icp2 if signal UP2 corresponds to an active logic level, and to provide substantially no current if signal UP2 corresponds to an inactive logic level. Similarly, current sink I1402 is arranged to provide a sink current as current Icp2 if signal DOWN2 corresponds to an active logic level, and to provide substantially no current if signal DOWN2 corresponds to an inactive logic level.

Also, VCO circuit 1471 is arranged to provide oscillator output signal VCO_out from signal Verr2 such that a frequency that is associated with signal VCO_out is associated with a voltage that is associated with signal Verr2. Further, 1/N clock divider circuit 1485 is arranged to provide signal PLL2_out by dividing a frequency that is associated with signal VCO_out. In one embodiment, 1/N clock divider circuit 1485 includes a counter.

During the operation of PLL circuit 1404, if the frequencies associated with signals PLL1_out and FP are not within the tolerance window, signals S_UP1 and S_DOWN1 are selected as signals UP2 and DOWN2. Accordingly, the feedback operation of PLL circuit 1404 causes the phase and frequency of signals FP to come closer to the phase and frequency of signal PLL1_out, until the frequencies of signals FP and PLL1_out are within the tolerance window. When the frequencies of signals FP and PLL1_out are within the tolerance window, signals S_UP2 and S_DOWN2 are selected as signals UP2 and DOWN2. Accordingly, the feedback operation of PLL circuit 1404 may cause the center of an active (i.e. high) pulse signal FP to lock to the leading edge of signal PLL1_out.

In one embodiment, by aligning the center of the pulse of signal FP to the leading edge of signal PLL1_out, the sawtooth current is properly aligned. In this embodiment, the center of the fall time of the sawtooth current corresponds to the center of the picture provided on the CRT display. Accordingly, in this embodiment, the picture provided by the CRT display appears in the center of the sweep, regardless of temperature variations. Also, in this embodiment, the center frequency of VCO circuit 1471 need not be adjusted when the frequency associated with signal PLL1_out changes.

Figure 15:
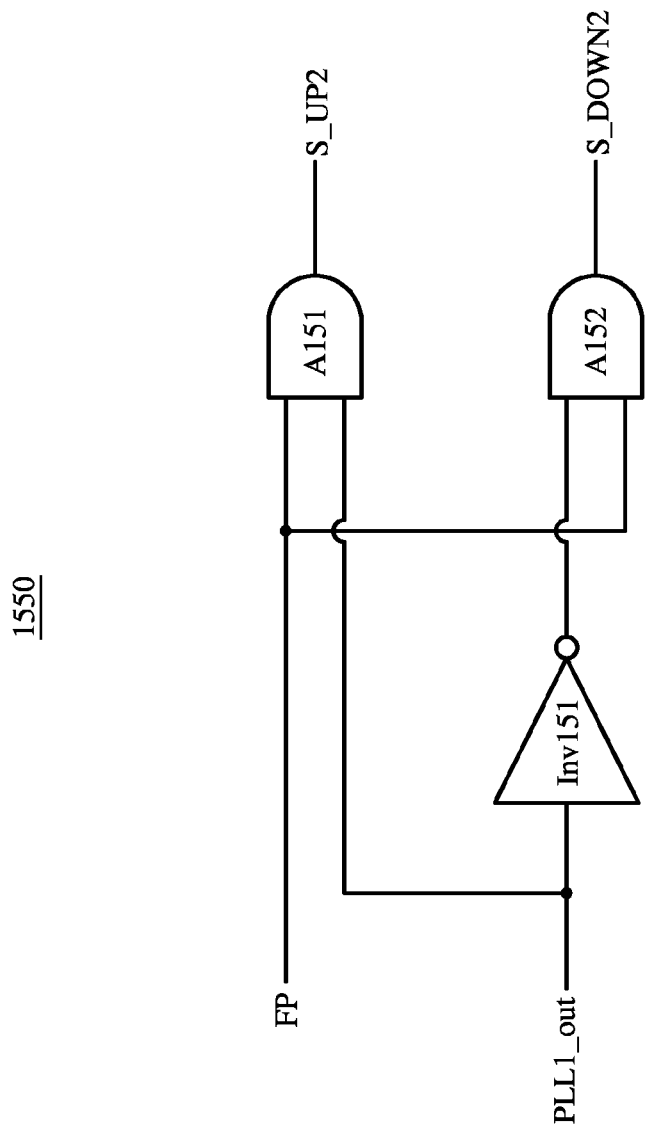
FIG. 15 schematically illustrates an embodiment of the phase detector circuit of FIGS. 13 and 14.

FIG. 15 schematically illustrates an embodiment of phase detector circuit 1550. Phase detector circuit 1550 may operate in a substantially similar manner as described with regard to phase detector circuit 1450 of FIG. 14, and may operate in a different manner in some ways. Phase detector circuit 1550 includes AND gates A151 and A152, and inverter INV151.

Figure 16:
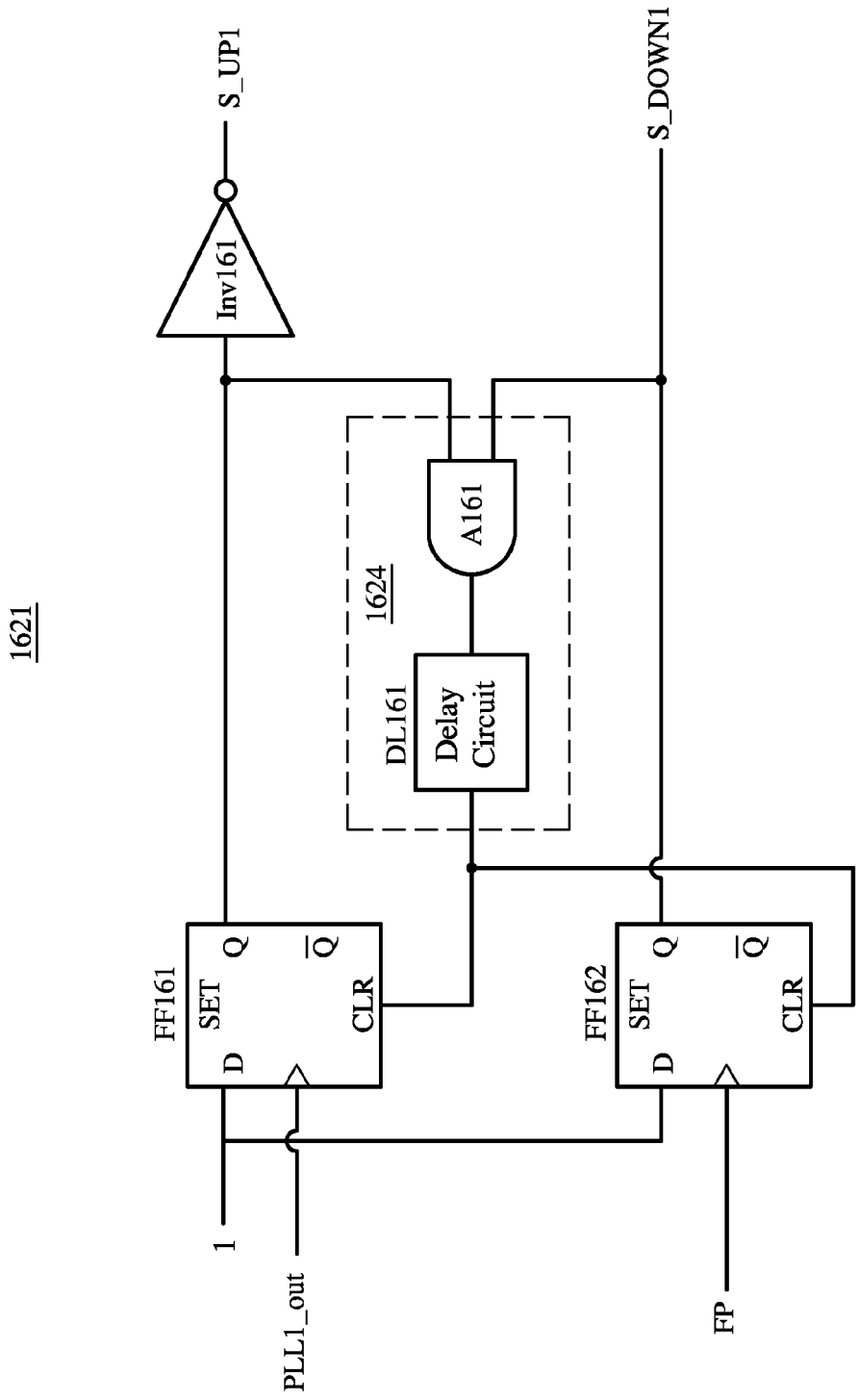
FIG. 16 shows a block diagram of an embodiment of the PFD circuit of FIGS. 13 and 14.

FIG. 16 shows a block diagram of an embodiment of PFD circuit 1621. PFD circuit 1621 may operate in a substantially similar manner as described with regard to PFD circuit 1421 of FIG. 14, and may operate in a different manner in some ways. PFD circuit 1621 includes flip-flops FF161–162, inverter INV161, and clear logic circuit 1624. In one embodiment, clear logic circuit 1624 includes AND gate A161 and delay circuit DL161.

Figure 17:
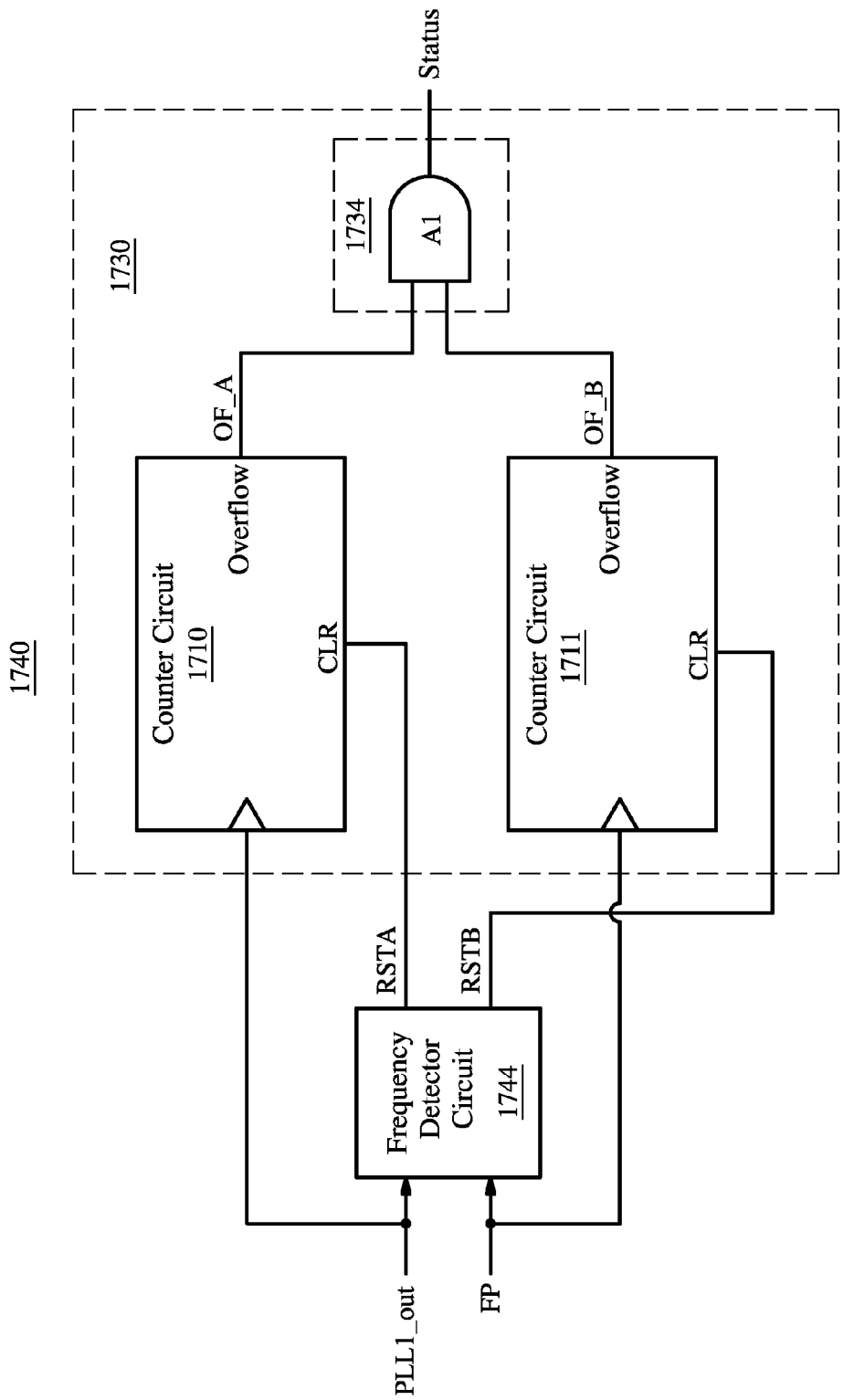
FIG. 17 illustrates a block diagram of an embodiment of the frequency comparator circuit of FIGS. 13 and 14.

FIG. 17 illustrates a block diagram of an embodiment of frequency comparator circuit 1740. Frequency comparator circuit 1740 includes frequency detector circuit 1744 and tolerance circuit 1730. An embodiment of tolerance circuit 1730 includes counter circuit 1710, counter circuit 1711, and logic circuit 1734. In one embodiment, logic circuit 1734 includes AND gate A1.

In operation, frequency detector circuit 1744 is configured to provide first reset signal RSTA and second reset signal RSTB from signals PLL1_out and FP.

In one embodiment, frequency detector circuit 1744 is configured to provide signals RSTA and RSTB as follows. If fIN1>fIN2, signal RSTA has a first parameter that is related to fIN1−fIN2, where fIN1 and fIN2 are the frequencies that are associated with signals PLL1_out and FP, respectively. Alternatively, if fIN1<fIN2, signal RSTB has a second parameter that is related to fIN2−fIN1.

In one embodiment, if fIN1≧fIN2, fRSTB is substantially zero, where fRSTB is the frequency that is associated with signal RSTB. In one embodiment, if fIN1≦fIN2, fRSTA is substantially zero, where fRSTA is the frequency that is associated with signal RSTA.

In one embodiment, at least if 2*fIN2>fIN1>fIN2, fRSTA is substantially equal to fIN1−fIN2. In one embodiment, at least if 2*fIN1<fIN2<fIN1, fRSTB is substantially equal to fIN2−fIN1. The difference between fIN1 and fIN2 is the beat frequency of signals PLL1_out and FP.

Tolerance circuit 1730 is configured to provide a status signal (Status) from signals IN1, IN2, RSTA, and RSTB. Further, tolerance circuit 1730 is configured to provide signal Status such that signal Status corresponds to a first logic level if the difference between the fIN1 and fIN2 are within a tolerance window, and to a second logic level otherwise. In one embodiment, tolerance circuit 1730 is arranged to provide signal Status as follows.

Counter circuit 1710 is arranged to receive signal PLL1_out at a clock input of counter circuit 1710, and counter circuit 1711 is arranged to receive signal FP at a clock input of circuit 1711. Further, counter circuit 1710 is arranged to increment a first count value when a positive edge occurs in signal PLL1_out. Similarly, counter circuit 1711 is arranged to increment a second count value when a positive edge occurs in signal PLL1_out. Although a positive edge triggered condition is described, in other embodiments, counter circuits 1710 and 1711 may be triggered by a negative edge, level-triggered, and the like.

Additionally, counter circuit 1710 is arranged to reset the first count value (e.g. to zero) if signal RSTA is asserted. Similarly, counter circuit 1711 is arranged to reset the second count value (e.g. to zero) if signal RSTB is asserted.

Further, counter circuit 1710 is configured to provide a first overflow signal (OF_A) at an overflow output such that signal OF_A is asserted if counter circuit 1710 overflows. Similarly, counter circuit 1711 is configured to provide a second overflow signal (OF_B) at an overflow output of counter circuit 1711 such that signal OF_B is asserted if counter circuit 1711 overflows.

In one embodiment, counter circuit 1710 overflows if fIN1<fIN2+tol1, and counter circuit 1711 overflows if fIN2<fIN1+tol2. Accordingly, in this embodiment, counter circuits 1710 and 1711 both overflow if fIN1−fIN2<tol1 and fIN2−fIN1<tol2. Also, AND gate A1 is arranged to provide signal Status by performing an AND function on signals OF_A and OF_B. Accordingly, signal Status has a high logic level if fIN1 and fIN2 are within the tolerance window of each other, and has a low logic level otherwise. In other embodiments, AND gate A1 may be replaced with another circuit that is configured to provide signal Status using the same truth table as an AND gate, and the like. In one embodiment, tol1 is substantially given by fIN1/(M1*[fIN1−fIN2]), where M1 is the maximum count value of counter circuit 1710. Similarly, in one embodiment, tol2 is substantially given by fIN2/(M2*[fIN2−fIN1]), where M2 is the maximum count value of counter circuit 1711.

In one embodiment, tol1 and tol2 provide the tolerance window, where tol1 is an upper tolerance value for fIN1, and tol2 is a lower tolerance value for fIN1.

Figure 18:
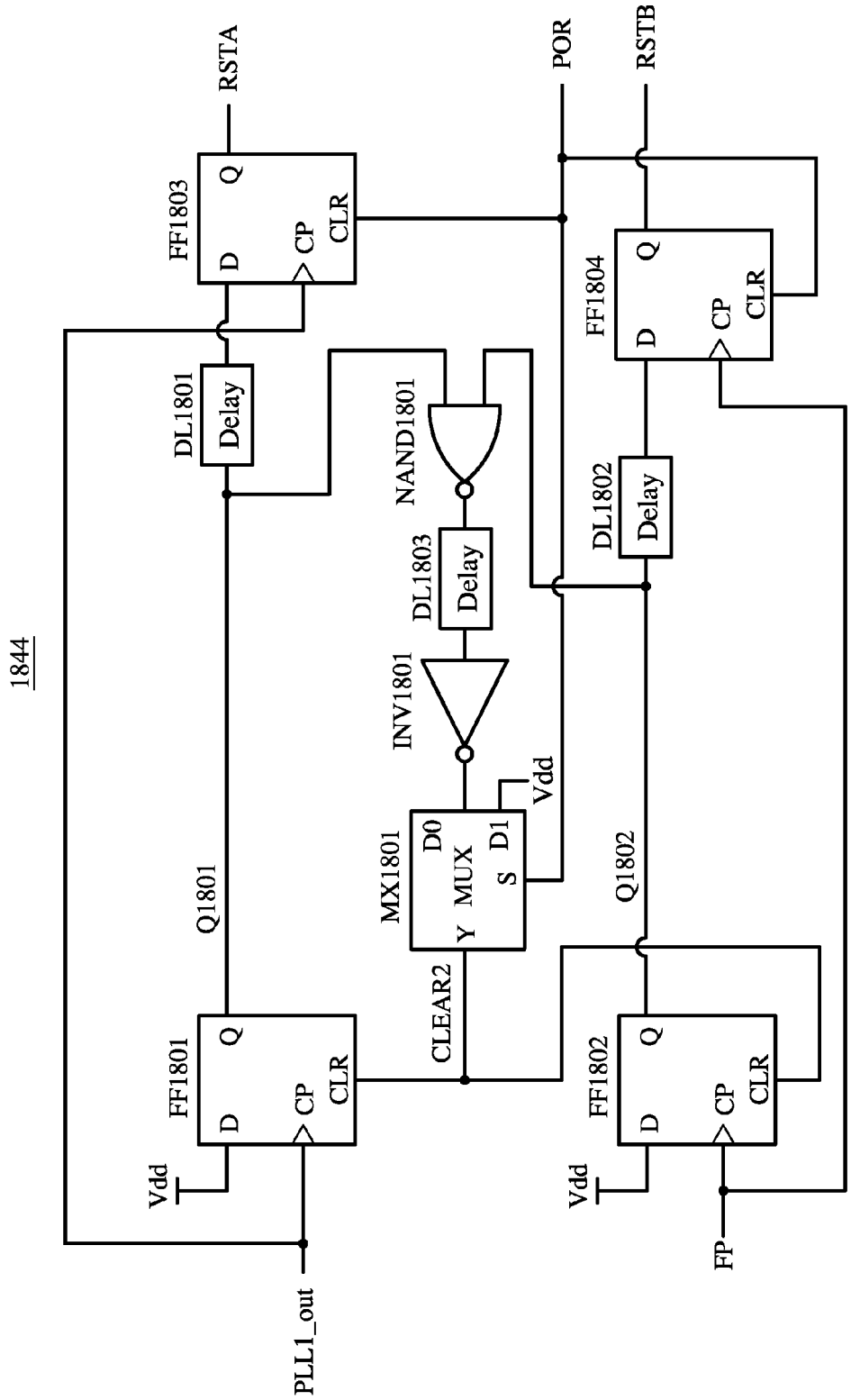
FIG. 18 shows a block diagram of an embodiment of the frequency detector circuit of FIG. 17.

FIG. 18 shows a block diagram of an embodiment of frequency detector circuit 1844. Frequency detector circuit 1844 may operate in a substantially similar manner as frequency detector circuit 1744 of FIG. 17, and may operate differently in some ways. Frequency detector circuit 1844 includes flip-flops FF1801–FF1804 and a clear logic circuit. In one embodiment, the clear logic circuit includes delay circuits DL1801–DL1803, NAND gate NAND1801, inverter INV1801, and multiplexer MX201.

The clear logic circuit may be arranged to activate a clear signal (CLR) if signal Q1801 and signal RSTA correspond to a first logic level, and arranged to deactivate signal CLEAR2 if at least one of signal Q1801 and signal RSTA corresponds to a second logic level. FF1801 may be arranged to set signal Q1801 to the first logic level in response to signal PLL1_out if signal CLEAR2 is deactivated, and arranged to reset signal Q1801 to the second logic level if signal CLEAR2 is activated. FF1802 may be arranged to set signal RSTA to the first logic level in response to signal FP if signal CLEAR2 is deactivated, and arranged to reset signal RSTA to the second logic level if signal CLEAR2 is activated. FF1803 may be arranged to activate signal RSTA in response to signal PLL1_out if signal Q1801 corresponds to the first logic level, such that signal RSTA is activated if signal PLL1_out pulses twice before signal CLEAR2 is activated. FF1804 may be arranged to activate signal RSTB in response to signal FP if signal RSTA corresponds to the first logic level, such that signal RSTB is activated if signal FP pulses twice before signal CLEAR2 is activated.

Frequency detector circuit 1844 is arranged such that signals RSTA and RSTB are dependent on fIN1 and fIN2, and such that signals RSTA and RSTB are substantially independent of the phases of signals PLL1_out and FP.

If fIN1≧fIN2, fRSTB is substantially zero. Similarly, if fIN1<fIN2, fRSTA is substantially zero.

If 2*fIN2>fIN1>fIN2, then fRSTA is substantially given by fIN1−fIN2, and the duty cycle of signal RSTA is substantially 50%. If fIN1>2*fIN2, signal RSTA behaves in a similar manner, except that, occasionally, a pulse of signal RSTA has a pulse duration of 2/fIN1 instead of 1/FIN1. If fIN1>>fIN2, fRSTA is substantially the same as fIN2, and the duty cycle of signal RSTA is substantially given by (fIN1−fIN2)/fIN1.

Similarly, if 2*fIN1>fIN2>fIN1, then fRSTB is substantially given by fIN2−fIN1, and the duty cycle of signal RSTB is substantially 50%. If fIN2>2*fIN1, RSTB behaves in a similar manner, except that, occasionally, a pulse of signal fRSTB has a pulse duration of 2/fIN2 instead of 1/FIN2. If fIN1<<fIN2, fRSTB is substantially the same as fIN1, and the duty cycle of signal RSTB is substantially given by (fIN2−fIN1)/fIN2.

Referring back to FIG. 17, in one embodiment, circuit 1700 includes counter circuits 1710 and 1711, further includes frequency detector circuit 1844 as an embodiment of frequency detector circuit 1720, and counter circuits 1710 and 1711 are both C bit counters. In this embodiment, if fIN1 and fIN2 are within a $\frac{1}{2}^C$ tolerance of each other, signal Status is high. Otherwise, signal Status is low. This may be more readily understood through the following mathematical calculations.

If 2*fIN2>fIN1>fIN2, in order for a pulse to occur in signal RSTA for a duration of (N−1) pulses of signal FP, at least N pulses must occur in signal PLL1_out. The Nth pulse of signal PLL1_out must happen sooner than the (N−1)th pulse of signal FP in order to propagate a logic 1 at signal RSTA (i.e. two consecutive pulses of signal PLL1_out with no pulse of signal FP in between).

Accordingly, N*TA<(N−1)*TB, where TA and TB are the periods of signal PLL1_out and signal FP respectively.

$$=> TB < N*TB - N*TA$$

$$=> TB/(TB-TA) < N$$

$$=> (1/fIN2)/(1/fIN2 - 1/fIN1) < N$$

$$=> fIN1/(fIN1 - fIN2) < N$$

=>(fIN1−fIN2)/fIN1>1/N, for generating a pulse at signal RSTA during the (N)th pulse of signal PLL1_out, i.e. (fIN1−fIN2)/fIN1≦1/N, for no pulse to be generated at signal RSTA during the (N)th pulse of signal PLL1_out.

For example, if C is 5, 32 pulses of signal PLL1_out can overflow the counter. However, if there is one pulse of signal RSTA before 32 consecutive pulses of signal PLL1_out occur, counter 110 does not overflow. If fIN1>2*fIN2, signal PLL1_out does not remain low long enough for counter 110 to overflow. Accordingly, if (fIN1−fIN2)/fIN1≦1/32, counter circuit 110 overflows.

Similarly, if (fIN2−fIN1)/fIN2≦1/32, counter circuit 111 overflows. If counter circuits 110 and 111 both overflow, fIN2 and fIN1 are similar, within ±1/32 tolerance. If counter circuits 110 and 111 both overflow, signal Status corresponds to logic 1.

The time duration, TRSTA, between two single pulses of signal RSTA if fIN1 and fIN2 are close and fIN1>fIN2, is given by $$TRSTA/TA - TRSTA/TB = 1$$

$$=> TRSTA*fIN1 - TRSTB*fIN2 = 1$$

$$=> TRSTA = 1/(fIN1-fIN2)$$

$$=> fRSTA = (fIN1-fIN2)$$

Figure 19:
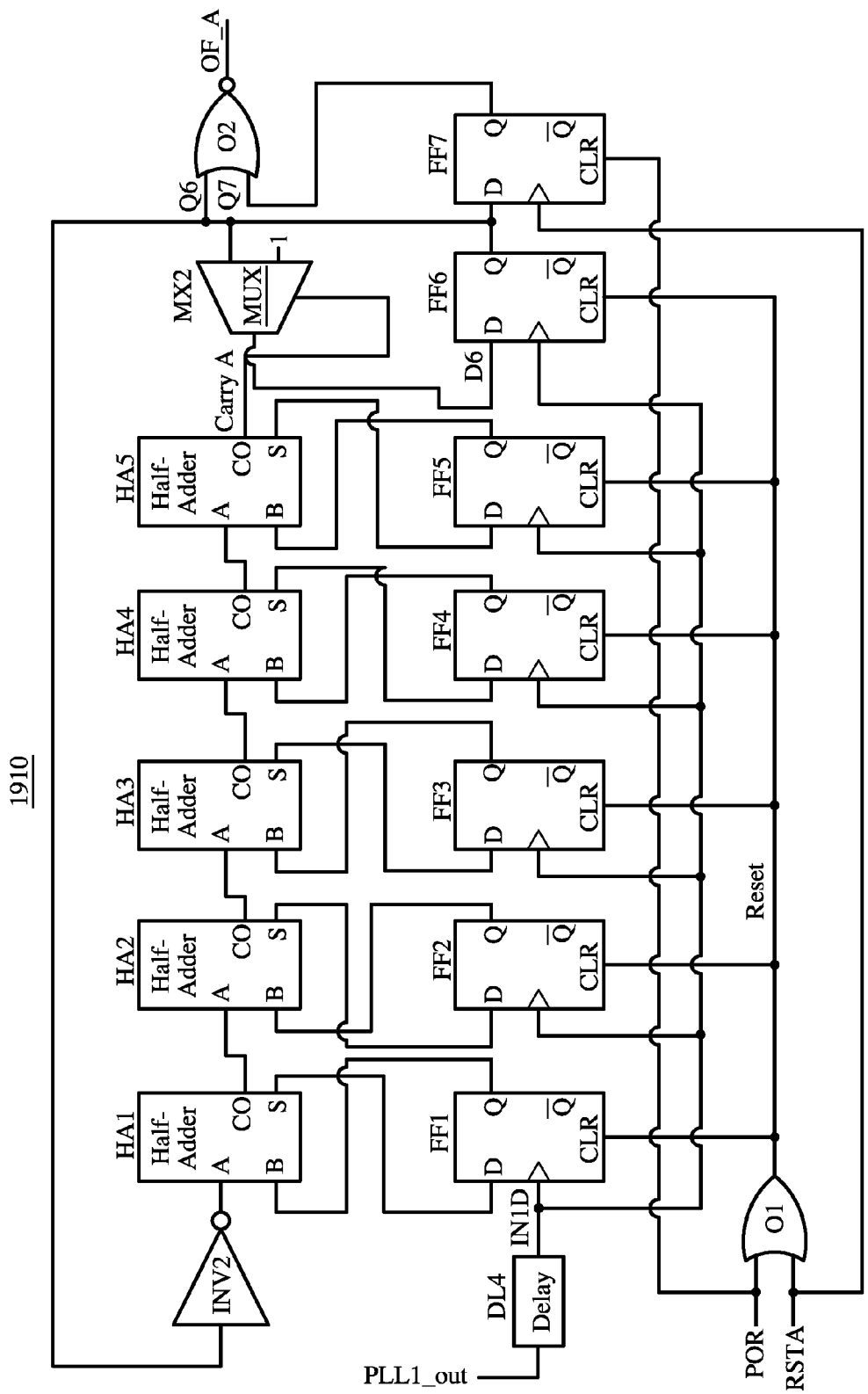
FIG. 19 illustrates a block diagram of an embodiment of one of the counter circuits of FIG. 17, arranged in accordance with aspects of the invention.

FIG. 19 illustrates a block diagram of an embodiment of counter circuit 1910. Counter circuit 1910 may operate in a substantially similar manner as counter circuit 1710 of FIG. 17, and may operate differently in some ways. Counter circuit 1711 may be arranged in a substantially similar manner to counter circuit 1910. Counter circuit 1910 may include flip-flops FF1–FF7, half-adders HA1–HA5, OR gates O1–O2, inverter INV2, multiplexer MX2, and delay circuit DL4.

Delay circuit DL4 is configured to provide signal IN1D from signal PLL1_out. FF1–FF5 are arranged as a register that is configured to store the first count value. Additionally, the register is arranged to be clocked by signal IN1D. HA1–HA5 and INV2 are arranged as a look-ahead logic circuit. Also, OR gate circuit O1 is configured to provide signal Reset from signal POR and signal RSTA.

FF6 and MX2 are arranged to operate as follows. MX2 is arranged to provide signal D6 from signal Q6 such that, when FF6 is clocked, signal D6 has the same logic level as signal Q6 if signal carryA is low, and such that signal D6 is high if signal carryA is high. Signal carryA is high only if counter 1910 overflows. Additionally, Q6 is reset to low if signal Reset is high. Accordingly, Q6 is set high only when counter circuit 1910 overflows, and only remains high until signal Reset is high.

FF7 is arranged to store the overflow condition. Also, OR gate O2 is arranged to provide signal OF_A such that signal OF_A is high if either Q6 or Q7 are high. If the overflow condition occurs, carryA changes to high, which in turn causes Q6 to change to high, as previously described. Since Q6 is high, OF_A is high. Next, when signal Reset changes to high, Q6 is changed to low, and Q7 is changed to high. At this point, OF_A remains high, since Q7 is high. Q7 remains high until the next leading edge of signal Reset, which causes Q7 to change back to low.

As discussed, FF7 and OR gate O2 are used to temporarily store the overflow condition. If fIN1 is greater than fIN2, even if signal fIN1 is very close to fIN2, signal RSTA still has an occasional pulse. FF7 and OR gate O2 are arranged to prevent Status from immediately changing to low if this happens.

Although one embodiment of counter circuit 1910 is described above for illustrative purposes, other embodiments of counter circuit 1910 are within the scope of the invention.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for horizontal deflection, comprising:
   a first phase-locked loop circuit that is arranged to provide a first phase-locked loop output signal based, in part, on a sync signal; and
   a second phase-locked loop circuit that is arranged to provide a second phase-locked loop output signal based, in part, on the first phase-locked loop output signal and a flyback pulse signal, wherein the flyback pulse signal is based, in part, on the second phase-locked loop output signal, and wherein the first phase-locked loop circuit is arranged to provide the first phase-locked loop output signal such that, if the sync signal includes equalizing pulses, the equalizing pulses do not affect the first phase-locked loop output signal.

2. A circuit for horizontal deflection, comprising:
   a first phase-locked loop circuit that is arranged to provide a first phase-locked loop output signal based, in part, on a sync signal; and
   a second phase-locked loop circuit that is arranged to provide a second phase-locked loop output signal based in part, on the first phase-locked loop output signal and a flyback pulse signal, wherein the flyback pulse signal is based in part on the second phase-locked loop output signal, and wherein the second phase-locked loop circuit is arranged to provide the second phase-locked loop output signal such that a center of a pulse of the second phase-locked loop output signal is substantially aligned with a leading edge of the first phase-locked loop output signal.

3. The circuit of claim 2, wherein the first phase-locked loop circuit includes a gated phase-frequency detector circuit.

4. A circuit for horizontal deflection, comprising:
   a first phase-locked loop circuit that is arranged to provide a first phase-locked loop output signal based, in part, on a sync signal; and
   a second phase-locked loop circuit that is arranged to provide a second phase-locked loop output signal based, in part, on the first phase-locked loop output signal and a flyback pulse signal, wherein the flyback pulse signal is based, in part, on the second phase-locked loop output signal, and wherein the second phase-locked loop circuit includes:
   a phase-frequency detector circuit that includes a first phase-frequency input that is arranged to receive the first phase-locked loop output signal, a second phase-frequency input that is coupled to a feedback node, and a phase-frequency output;
   a phase detector circuit that includes first and second phase inputs and a phase output, wherein the first phase input is coupled to the first phase-frequency input, and wherein the second phase input is coupled to the feedback node;
   a frequency comparator circuit that includes first and second frequency inputs and a frequency output, wherein the first frequency input is coupled to the first phase input, and wherein the second frequency input is coupled to the feedback node; and a multiplexer circuit that includes a first multiplexer input that is coupled to the phase-frequency output, a second multiplexer input that is coupled to the phase output, a select input that is coupled to the frequency output, and a multiplexer output.

5. The circuit of claim 4, wherein the phase output includes a phase up output and a phase down output; and wherein the phase detector circuit is arranged to provide a phase up signal at the phase up output such that the phase up signal corresponds to an active logic level if the feedback signal corresponds to the active logic level and the input clock signal corresponds to the active logic level, and corresponds to an inactive logic level otherwise; and further arranged to provide a phase down signal at the phase down output such that the phase down signal corresponds to the active logic level if the feedback signal corresponds to the active logic level and the input clock signal corresponds to the inactive logic level, and corresponds to the inactive logic level otherwise.

6. The circuit of claim 4, wherein the frequency comparator circuit includes:

a frequency detector circuit including a first input that is coupled to the first phase input a second input that is coupled to the feedback node, and first and second outputs;

a first counter circuit including a clock input that is coupled to the first input of the frequency detector circuit, a clear input that is coupled to the first input of the frequency detector circuit, and a first overflow output;

a second counter circuit including a clock input that is coupled to the second input of the frequency detector circuit, and a clear input that is coupled to the second input of the frequency detector circuit, and a second overflow output; and a logic circuit including a first input that is coupled to the first overflow output, a second input that is coupled to the second overflow output, and an output that is coupled to the select input.

7. The circuit of claim 4, wherein the second phase-locked loop circuit further includes:

a charge pump circuit that is coupled to the multiplexer output; and a voltage-controlled oscillator circuit that is coupled to the charge pump circuit, wherein the voltage-controlled oscillator circuit is arranged to provide an oscillator output signal, wherein the second phase-locked loop output signal is based, in part, on the oscillator output signal;

a low-pass filter circuit that is coupled to the charge pump circuit and the voltage-controlled oscillator circuit; and a clock divider circuit that is arranged to provide the second phase-locked loop output signal from the oscillator output signal, wherein the clock divider circuit is arranged to provide the second phase-locked loop output signal to a sawtooth current generator circuit; the sawtooth current generator circuit is arranged to provide a sawtooth current from the second phase-locked loop output signal; the sawtooth generator circuit is arranged to provide the sawtooth current to a flyback pulse generator circuit; and wherein the flyback pulse generator circuit is arranged to provide the flyback pulse signal based, in part, on the sawtooth current.

8. A circuit for horizontal deflection, comprising:

a first phase-locked loop circuit that is arranged to provide a first phase-locked loop output signal based, in part, on a sync signal; and a second phase-locked loop circuit that is arranged to provide a second phase-locked loop output signal based, in part, on the first phase-locked loop output signal and a flyback pulse signal wherein the flyback pulse signal is based, in part, on the second phase-locked loop output signal, and wherein the first phase-locked loop circuit includes:

a gated phase-frequency detector circuit that is arranged to receive the sync signal;

a charge pump circuit that is coupled to the gated phase-frequency detector circuit;

a loop filter circuit that is coupled to the charge pump circuit;

a voltage-controlled oscillator circuit that is coupled to the loop filter circuit;

multi-phase pulse generator circuit that is coupled to the voltage-controlled oscillator circuit and the gated phase-frequency detector circuit; and an equalizing pulse removal logic circuit that is coupled to the multi-phase pulse generator circuit and the gated phase-frequency detector circuit.

9. The circuit of claim 8, wherein the gated phase-frequency detector circuit includes a multiplexer circuit and a phase-frequency detector that is coupled to the multiplexer circuit.

10. The circuit of claim 9, wherein the phase-frequency detector that includes first and second detector inputs, a reference input, a feedback input, an up output, and a down output; the multiplexer circuit includes first and second multiplexer inputs, a select multiplexer input, and a multiplexer output; the first multiplexer input is coupled to the up output; and wherein the multiplexer output is coupled to the first detector input.

11. The circuit of claim 10, wherein the equalizing pulse removal logic circuit includes a lock detector circuit; the gated phase-frequency detector circuit is arranged to receive a sync signal, a feedback signal, and a sync gate signal, and further arranged to provide up and down signals; the charge pump circuit is arranged to provide a charge pump current based, in part, on the up and down signals; the loop filter circuit is arranged to provide an error voltage based, in part, on the charge pump current; the voltage-controlled oscillator circuit is arranged to provide a voltage-controlled oscillator output signal based, in part, on the error voltage; the multi-phase generator circuit is arranged to provide the feedback signal and a gate signal based, in part, on the voltage-controlled oscillator output signal; and wherein the lock detector circuit is arranged to provide a lock detector output signal based, in part, on the sync signal and the feedback signal.

12. The circuit of claim 11, wherein the gated phase-frequency detector circuit is arranged such that a triggering edge of the sync gate signal does not affect the up signal if the sync gate signal corresponds to an active logic level; the lock detector circuit is arranged to provide the lock detector output signal such that the lock detector circuit corresponds to a first logic level if the feedback signal is substantially locked to the sync signal; and wherein the multi-phase pulse generator circuit is arranged to provide the feedback signal and the gate signal such that the feedback signal and the gate signal have substantially the same frequency, and such that the gate signal leads the feedback signal.

13. The circuit of claim 12, wherein the multi-phase pulse generator circuit is arranged to provide the gate signal such that the gate signal leads the feedback signal by approximately one-fourth of a period.

14. The circuit of claim 12, wherein the equalizing pulse removal logic circuit further includes a sync gate logic circuit that is arranged to provide a sync gate signal such that the sync gate signal corresponds to an active logic level if the lock detector output signal corresponds to an inactive logic level, and such that the sync gate signal corresponds to the active logic level if the gate signal corresponds to the first logic level.

15. The circuit of claim 14, wherein the sync gate logic circuit includes an OR gate that is arranged to provide the sync gate signal based, in part, on the lock detector output signal and the gate signal.

16. The circuit of claim 14, wherein the equalizing pulse removal logic circuit further includes a pulse counter circuit that includes an overflow output, the pulse counter circuit is arranged to provide an overflow signal at the overflow output; the sync gate signal also corresponds to an active logic level if the overflow signal is asserted; the sync gate logic circuit includes an OR gate that is arranged to provide the sync gate signal based, in part, on the lock detector output signal, the gate signal, and the overflow signal; the pulse counter circuit further includes a synchronous reset; the equalizing pulse removal logic circuit further includes a pulse counter synchronous reset logic circuit that is arranged to provide a synchronous reset signal to the synchronous reset based, in part, on the gate signal and the sync signal; the pulse counter synchronous reset logic circuit includes a flip-flop that is arranged to provide a delayed gate signal based on the gate signal and the sync signal; and wherein the pulse counter synchronous reset logic circuit further includes an XNOR gate that is arranged to provide the synchronous reset signal based on the delayed gate signal and the gate signal.

17. A circuit for horizontal deflection, comprising:
a first phase-locked loop circuit, including a first phase-locked loop output and a gated phase-frequency detector circuit; and
a second phase-locked loop circuit, including:
a phase-frequency detector circuit that includes a first phase-frequency input that is coupled to the first phase-locked loop output, a second phase-frequency input that is coupled to a feedback node, and a phase-frequency output;
a phase detector circuit that includes first and second phase inputs and a phase output, wherein the first phase input is coupled to the first phase-frequency input, and wherein the second phase input is coupled to the feedback node;
a frequency comparator circuit that includes first and second frequency inputs and a frequency output, wherein the first frequency input is coupled to the first phase input, and wherein the second frequency input is coupled to the feedback node; and
a multiplexer circuit that includes a first multiplexer input that is coupled to the phase-frequency output, a second multiplexer input that is coupled to the phase output, a select input that is coupled to the frequency output, and a multiplexer output.

18. The circuit of claim 17, wherein the first phase-locked loop circuit further includes:
a charge pump circuit that is coupled to the gated phase-frequency detector circuit;
a loop filter circuit that is coupled to the charge pump circuit;
a voltage-controlled oscillator circuit that is coupled to the loop filter circuit;
a multi-phase pulse generator circuit that is coupled to the voltage-controlled oscillator circuit, the gated phase-frequency detector circuit, and the phase-frequency detector circuit; and
an equalizing pulse removal logic circuit that is coupled to the multi-phase pulse generator circuit and the gated phase-frequency detector circuit.

19. An apparatus, comprising:
means for providing a first phase-locked loop output signal based, in part, on a sync signal; and
means for providing a second phase-locked loop output signal such that a center of a pulse of the second phase-locked loop output signal is substantially aligned with a leading edge of the first phase-locked loop output signal.

* * * * *

UNITED STATES PATENT AND TRADEMARK OFFICE
CERTIFICATE OF CORRECTION

PATENT NO. : 7,102,398 B1
APPLICATION NO. : 10/880954
DATED : September 5, 2006
INVENTOR(S) : Hon Kin Chiu It is certified that error appears in the above-identified patent and that said Letters Patent is hereby corrected as shown below:

Title Page Col. 2 (Attorney, Agent, or Firm), Line 1, Delete "PC;" and insert -- P.C.; - -.

Sheet 12 of 19, Col. 1 (Fig. 12), Line 15, Delete "S-reset" and insert -- S_reset --.

Sheet 13 of 19, (Beside Box 1350), (Fig. 13), Line 1, Delete "PLL1-out" and insert -- PLL1_out --.

Sheet 14 of 19 (Box 1440) (Fig. 14), Line 3, Delete "Citcuit" and insert -- Circuit --.

Sheet 14 of 19 (Box 1421) (Fig. 14), Line 4, Delete "Citcuit" and insert -- Circuit --.

Sheet 14 of 19 (Box 1450) (Fig. 14), Line 3, Delete "Citcuit" and insert -- Circuit --.

Column 6, Line 54, Delete "Sync gate" and insert -- Sync_gate --.

Column 7, Line 7, Delete "Sync gate" and insert -- Sync_gate --.

Column 7, Line 10, Delete "Sync gate" and insert -- Sync_gate --.

Column 7, Line 26, Delete "Sync gate" and insert -- Sync_gate --.

Column 9, Line 61, Delete "11402" and insert -- I1402 --.

Column 12, Line 24, Delete "fIN1<fIN2," and insert -- fIN1 fIN2, --

Column 13, Line 26, (Approx.) After "=>fRSTA=(fIN1- fIN2)" insert -- . --.

Column 14, Line 31, In Claim 2, after "based" insert -- , --.

Column 14, Line 34, In Claim 2, after "based" insert -- , --.

Column 14, Line 34, In Claim 2, after "part" insert -- , --.

Column 15, Line 25, In Claim 6, after "input" insert -- , --.

Column 16, Line 8, In Claim 8, after "signal" insert -- , --.

UNITED STATES PATENT AND TRADEMARK OFFICE
CERTIFICATE OF CORRECTION

PATENT NO. : 7,102,398 B1
APPLICATION NO. : 10/880954
DATED : September 5, 2006
INVENTOR(S) : Hon Kin Chiu It is certified that error appears in the above-identified patent and that said Letters Patent is hereby corrected as shown below:

Column 17, Line 19, In Claim 16, delete "output," and insert -- output;--.

Signed and Sealed this

Twenty-second Day of May, 2007

JON W. DUDAS
*Director of the United States Patent and Trademark Office*